(12) United States Patent
Hosono et al.

(10) Patent No.: US 7,978,499 B2
(45) Date of Patent: Jul. 12, 2011

(54) SEMICONDUCTOR STORAGE DEVICE

(75) Inventors: Koji Hosono, Fujisawa (JP); Satoru Takase, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 12/556,272

(22) Filed: Sep. 9, 2009

(65) Prior Publication Data
US 2010/0091551 A1 Apr. 15, 2010

(30) Foreign Application Priority Data
Oct. 10, 2008 (JP) ................... 2008-264319

(51) Int. Cl.
*G04B 25/02* (2006.01)
*G04B 27/00* (2006.01)
(52) U.S. Cl. ............... 365/148; 365/189.07; 365/189.09
(58) Field of Classification Search .................... 365/148
See application file for complete search history.

(56) References Cited

U.S. PATENT DOCUMENTS

| | | | |
|---|---|---|---|
| 6,141,241 A | 10/2000 | Ovshinsky et al. | |
| 6,961,993 B2 * | 11/2005 | Oohata | 29/832 |
| 7,057,922 B2 | 6/2006 | Fukumoto | |
| 2007/0139992 A1 * | 6/2007 | Nitta | 365/63 |
| 2007/0171762 A1 * | 7/2007 | Chen et al. | 365/233 |
| 2008/0106930 A1 * | 5/2008 | Kim et al. | 365/163 |
| 2008/0170435 A1 * | 7/2008 | Tokiwa et al. | 365/185.03 |
| 2008/0304308 A1 * | 12/2008 | Stipe | 365/51 |

FOREIGN PATENT DOCUMENTS

JP 2002-541613 12/2002

OTHER PUBLICATIONS

U.S. Appl. No. 12/710,661, filed Feb. 23, 2010, Hosono et al.

* cited by examiner

*Primary Examiner* — Hoai V Ho
*Assistant Examiner* — Min Huang
(74) *Attorney, Agent, or Firm* — Oblon, Spivak, McClelland, Maier & Neustadt, L.L.P.

(57) ABSTRACT

A semiconductor storage device includes: a memory cell array having memory cells; and a control circuit configured to apply a first voltage to a selected one of first wirings as well as a second voltage to a selected one of second wirings. The control circuit includes: a signal output circuit configured to output a first signal based on a first current flowing through a selected memory cell and a reference current; and a current retaining circuit configured to retain a second current flowing through the first wirings or a wiring electrically connected to the first wirings during a certain period of time. The signal output circuit is configured to determine the first current based on the second current retained by the current retaining circuit. The control circuit is configured to stop application of the first voltage to the first wirings based on the first signal.

20 Claims, 20 Drawing Sheets

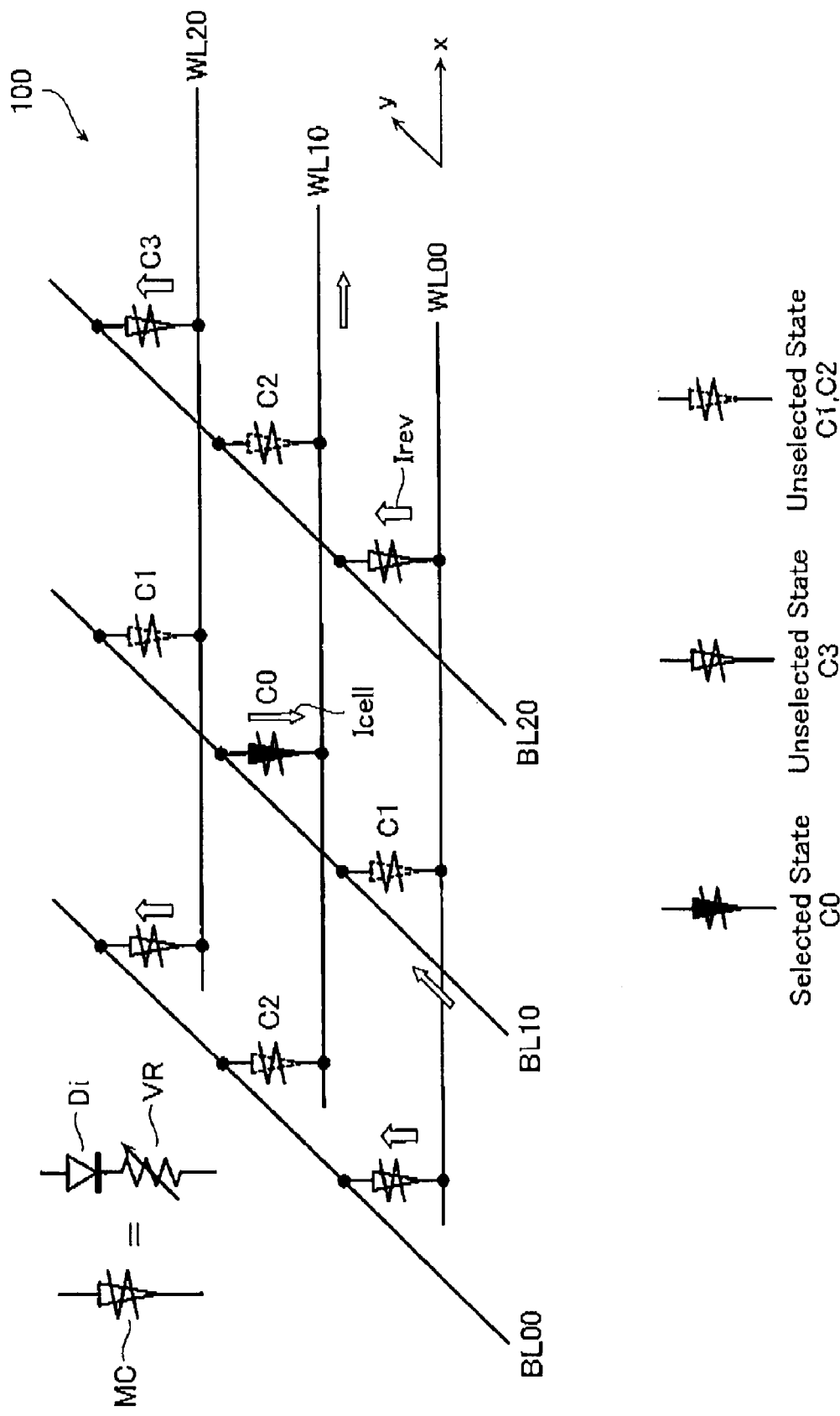

FIG. 1B

Table1

|  | Set Operation | Reset Operation | Read Operation |
| --- | --- | --- | --- |
| Selected BL | Vset | Vreset | Vread |
| Unselected BL | 0V | 0V | 0V |
| Selected WL | 0V | 0V | 0V |
| Unselected WL | Vset | Vreset | Vread |

FIG. 2B

Table2

|  | Set Operation | Reset Operation | Read Operation |
| --- | --- | --- | --- |
| Selected BL | Vset | Vreset | Vread |
| Unselected BL | V$\beta$ | V$\beta$ | 0V |
| Selected WL | 0V | 0V | 0V |
| Unselected WL | Vset−V$\alpha$ | Vreset−V$\alpha$ | Vread |

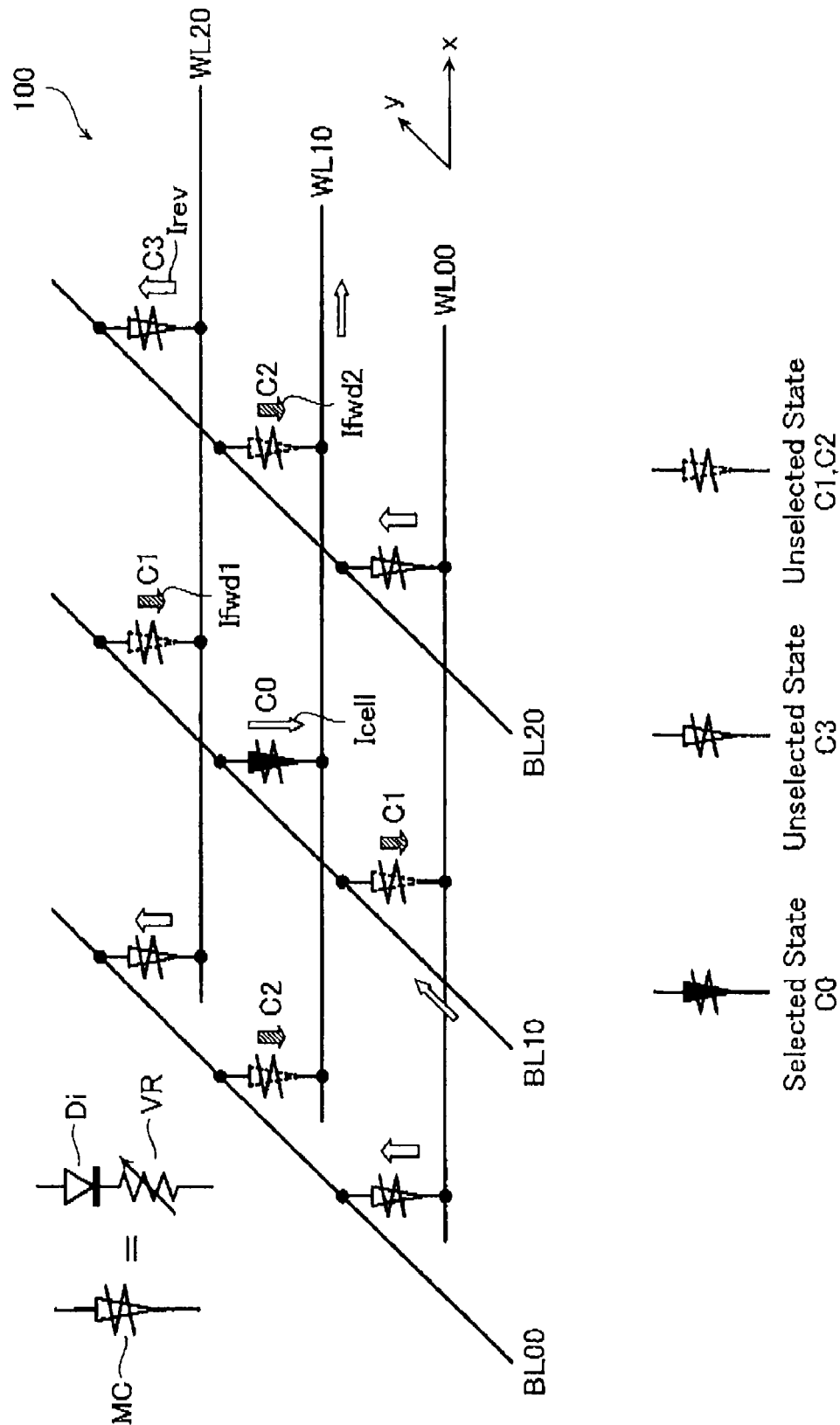

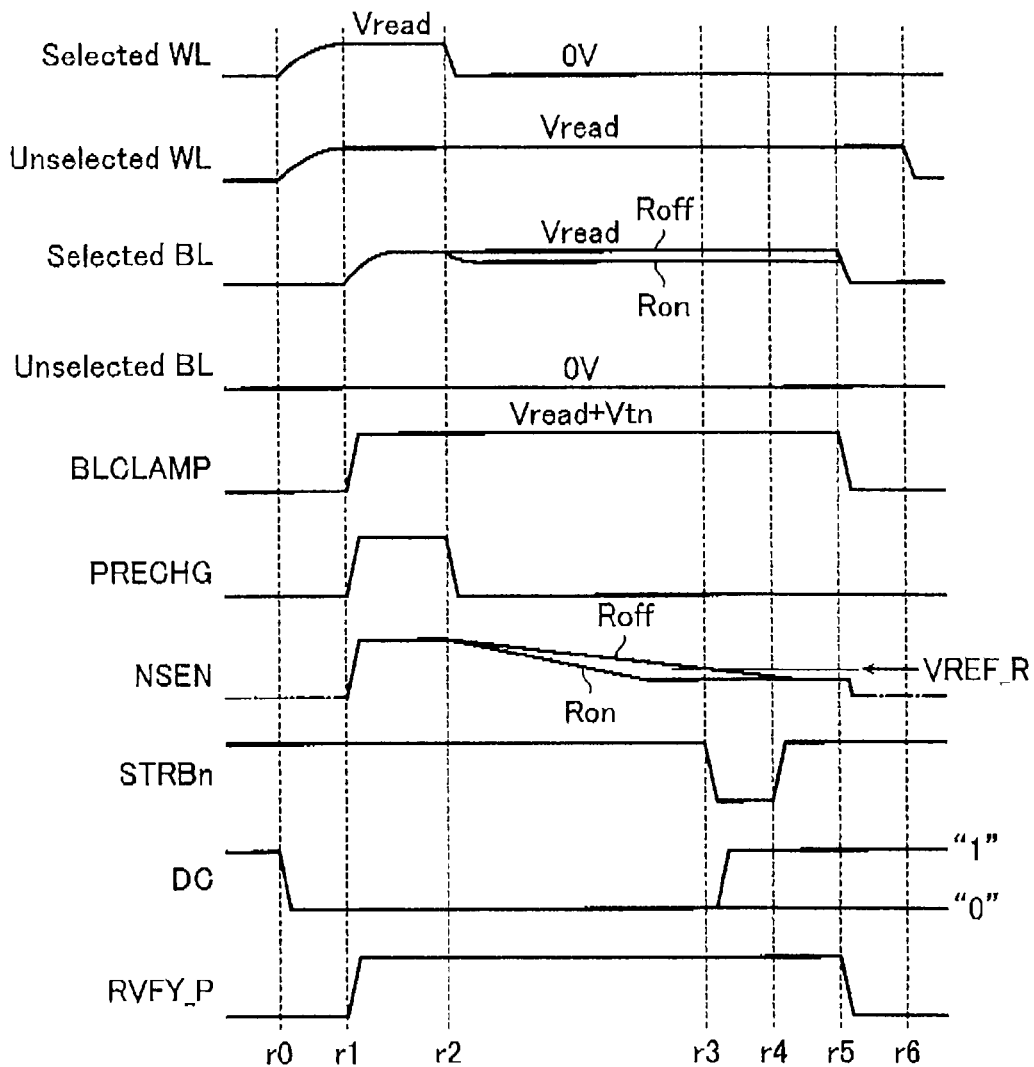

FIG. 12C

Table4 Set Operation

|  | "1"to"0" | "0"to"0" | "1"to"1" | "0"to"1" |
|---|---|---|---|---|
| RST_U=H | DC=H | DC=H | DC=H | DC=H |
| Data Load | DC=L | DC=L | DC=H | DC=H |
| <Set Pulse> | Vset | Vset | Vss | Vss |
| <Set Verify> Pre-charge | Vread | Vread | Vss | Vss |
| SENSE | NSEN=L/H GP=L/H | NSEN=L GP=L | NSEN=L GP=L | NSEN=L GP=L |
| STRBn | DC=LtoH (Pass) DC=LtoL (Fail) | DC=LtoH | DC=H | DC=H |

FIG. 13

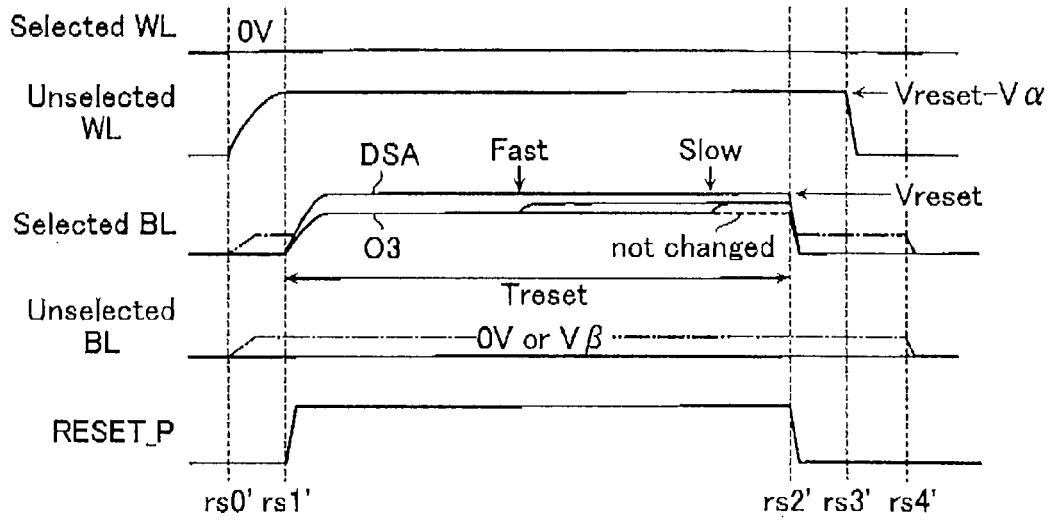

Reset Operation Waveform

FIG. 14B

Table5 Reset Operation

|  | "1"to"0" | "0"to"0" | "1"to"1" | "0"to"1" |
|---|---|---|---|---|
| RST_U=H | DC=H | DC=H | DC=H | DC=H |
| Active Set | DC=H | DC=H | DC=L | DC=L |
| <Pre Read> Pre-charge | Vss | Vss | Vread | Vread |
| SENSE | NSEN=L GP=H | NSEN=L GP=H | NSEN=H GP=L | NSEN=L GP=H |
| STRBn | DC=H | DC=H | DC=LtoH | DC=L |
| <Reset Pulse> | Vss | Vss | Vss | Vreset |
| <Reset Verify> Pre-charge | Vss | Vss | Vss | Vread |
| SENSE | NSEN=L GP=H | NSEN=L GP=H | NSEN=L GP=H | NSEN=L/H GP=H/L |
| STRBn | DC=H | DC=H | DC=H | DC=LtoH (Pass) DC=LtoL (Fail) |

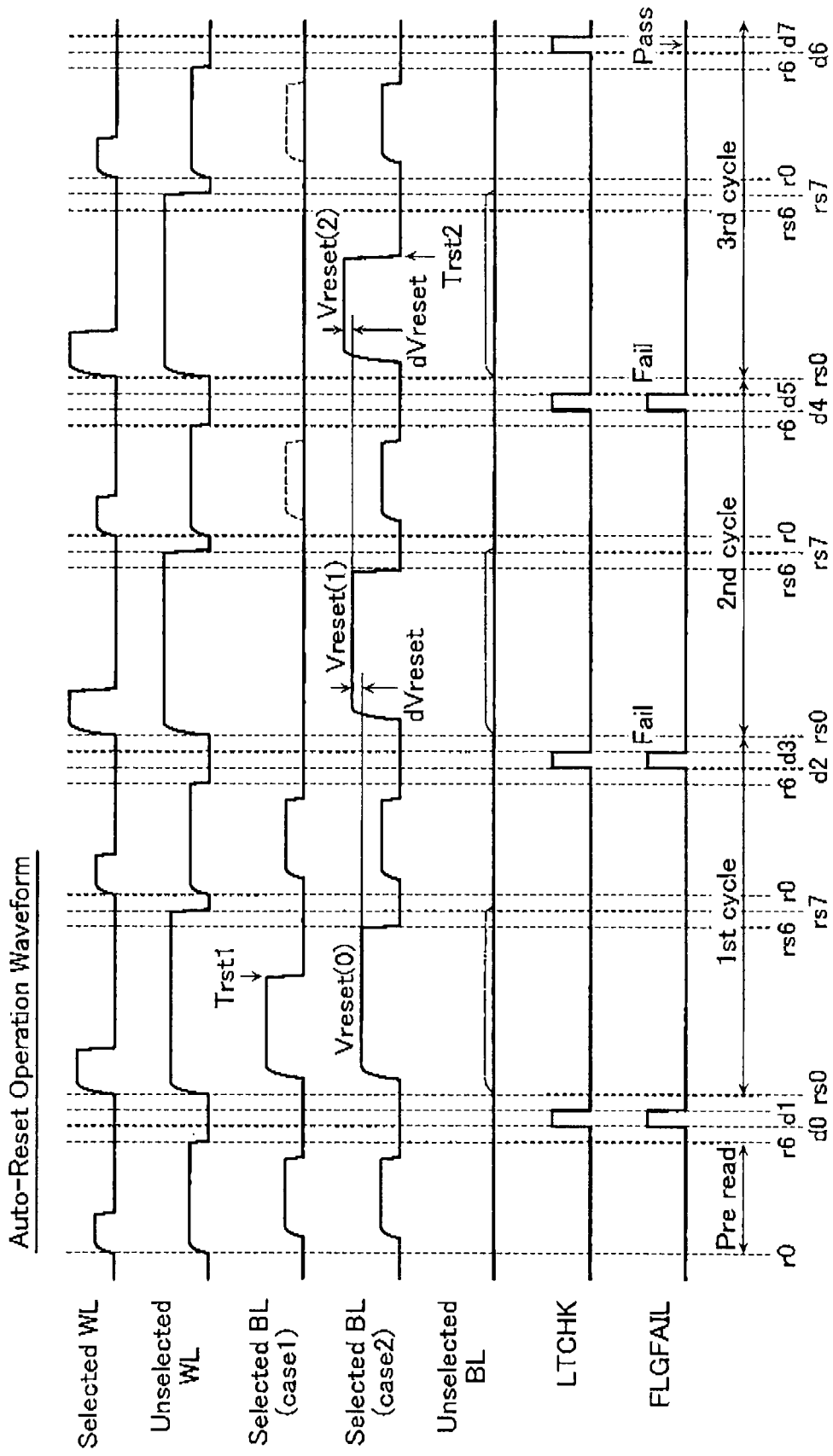

SEMICONDUCTOR STORAGE DEVICE

CROSS REFERENCE TO RELATED APPLICATIONS

This application is based on and claims the benefit of priority from prior Japanese Patent Application No. 2008-264319, filed on Oct. 10, 2008, the entire contents of which are incorporated herein by reference.

BACKGROUND OF THE INVENTION

1. Field of the Invention

The present invention relates to a semiconductor storage device.

2. Description of the Related Art

Resistive memory has attracted increased attention as a likely candidate for replacing flash memory. As described herein, it is assumed that the resistive memory devices include Resistive RAM (ReRAM), in a narrow sense, that uses a transition metal oxide as a recording layer and stores its resistance states in a non-volatile manner, as well as Phase Change RAM (PCRAM) that uses chalcogenide, etc., as a recording layer to utilize the resistance information of crystalline states (conductors) and amorphous states (insulators).

It is known that the variable resistance elements in resistive memory have two modes of operation. One is to set a high resistance state and a low resistance state by switching the polarity of the applied voltage, which is referred to as "bipolar type". The other enables the setting of a high resistance state and a low resistance state by controlling the voltage values and the voltage application time, without switching the polarity of the applied voltage, which is referred to as "unipolar type".

To achieve high-density memory cell arrays, the unipolar type is preferable. This is because that the unipolar type solution enables, without transistors, cell arrays to be configured by superposing variable resistance elements and rectifier elements, such as diodes, on respective intersections between bit lines and word lines. Moreover, large capacity may be achieved without an increase in cell array area by arranging such memory cell arrays laminated in a three-dimensional manner (see Japanese National Publication of International Patent Application No. 2002-541613).

For unipolar-type ReRAM, data is written to a memory cell by applying, for a short period of time, a certain voltage to a variable resistance element. As a result, the variable resistance element changes from a high resistance state to a low resistance state. The operation of changing a variable resistance element from a high resistance state to a low resistance state is hereinafter referred to as the "set operation". On the other hand, data is erased from a memory cell MC by applying, for a long period of time, a certain voltage that is lower than that applied in the set operation to a variable resistance element in its low resistance state after the set operation. As a result, the variable resistance element changes from a low resistance state to a high resistance state. The operation of changing a variable resistance element from a low resistance state to a high resistance state is hereinafter referred to as the "reset operation". For example, a memory cell takes a high resistance state as a stable state (reset state) and data is written to the memory cell by such a set operation that causes a reset state to be switched to a low resistance state for binary storage.

In reset operation, a voltage greater than a certain voltage should be applied to a memory cell including a variable resistance element, taking into account the voltage drop due to the parasitic resistance of the entire path along which a reset current flows. In that case, the voltage applied in reset operation will exceed that required for set operation of the memory cell, which may result in erroneous set operation of the memory cell after the completion of the reset operation.

SUMMARY OF THE INVENTION

One aspect of the present invention provides a semiconductor storage device comprising: a memory cell array having memory cells positioned at intersections between a plurality of first wirings and a plurality of second wirings, each of the memory cells including a rectifier element and a variable resistance element connected in series; and a control circuit configured to apply a first voltage to a selected one of the first wirings as well as a second voltage to a selected one of the second wirings, so that a first potential difference is applied to a selected memory cell positioned at an intersection between the selected one of the first wirings and the selected one of the second wirings, the control circuit comprising: a signal output circuit configured to output a first signal based on a first current flowing through the selected memory cell via the selected one of the first wirings and the selected one of the second wirings and a reference current; and a current retaining circuit configured to retain a second current flowing through the first wirings or a wiring electrically connected to the first wirings during a certain period of time, the signal output circuit being configured to determine the first current based on the second current retained by the current retaining circuit; and the control circuit being configured to stop application of the first voltage to the first wirings based on the first signal.

Another aspect of the present invention provides a semiconductor storage device comprising: a memory cell array having memory cells positioned at intersections between a plurality of first wirings and a plurality of second wirings, each of the memory cells including a rectifier element and a variable resistance element connected in series; and a control circuit configured to apply a first voltage to a plurality of first wirings selected from the first wirings as well as a second voltage to a selected one of the second wirings, so that a first potential difference is applied to a plurality of selected memory cells positioned at intersections between the plurality of first wirings selected from the first wirings and the selected one of the second wirings, the control circuit comprising: a signal output circuit configured to output a first signal based on a first current flowing through the selected memory cells via a selected one of the first wirings and a selected one of the second wirings and a reference current; and a current retaining circuit configured to retain a second current flowing through the first wirings or a wiring electrically connected to the first wirings during a certain period of time, the signal output circuit being configured to determine the first current based on the second current retained by the current retaining circuit; and the control circuit being configured to stop application of voltage to one selected memory cell based on the first signal, while continuing application of voltage to another selected memory cell based on the first signal.

Still another aspect of the present invention provides a semiconductor storage device comprising: a memory cell array having memory cells positioned at intersections between a plurality of first wirings and a plurality of second wirings, each of the memory cells including a rectifier element and a variable resistance element connected in series; and a control circuit configured to apply a first voltage to a plurality of first wirings selected from the first wirings, as well as a second voltage to a selected one of the second wirings, so that a first potential difference is applied to a plurality of selected memory cells arranged at intersections between the plurality of first wirings selected from the first wirings and the selected one of the second wirings, the control circuit comprising: a signal output circuit configured to output a first signal based on a first current flowing through the selected memory cells via a selected one of the first wirings and a selected one of the second wirings and a reference current; a current retaining circuit configured to retain a second current flowing through the first wirings or a wiring electrically connected to the first wirings during a certain period of time; and a detection circuit configured to read respective states of the plurality of selected memory cells after the first voltage and the second voltage are applied to a plurality of first wirings selected from the first wirings and a selected one of the second wirings, and detect whether the read resistance states of the selected memory cells have changed or not, the signal output circuit being configured to determine the first current based on the second current retained by the current retaining circuit; and the control circuit being configured to stop application of voltage to one selected memory cell based on the first signal, while continuing application of voltage to another selected memory cell based on the first signal, and the control circuit being configured to repeat application of the first voltage and the second voltage to the first wirings and the second wirings until the detection circuit detects that resistance states of all of the selected memory cells have changed.

BRIEF DESCRIPTION OF THE DRAWINGS

FIG. 1A illustrates a memory cell array of a resistive memory device according to embodiments of the present invention;

FIG. 1B is a table illustrating the states of voltage applied to bit lines and word lines in the resistive memory device according to embodiments of the present invention;

FIG. 2A illustrates the states of voltage applied in a memory cell array of the resistive memory device according to embodiments of the present invention;

FIG. 2B is a table illustrating the states of voltage applied to bit line and word lines in the resistive memory device according to embodiments of the present invention;

FIG. 11A is a timing chart illustrating a read operation of the resistive memory device of the first embodiment;

FIG. 11B illustrates a read operation of the resistive memory device of the first embodiment;

FIG. 12C illustrates a set operation of the resistive memory device of the first embodiment;

FIG. 13 is a timing chart illustrating a reset operation of a resistive memory device according to a comparative example;

FIG. 14B illustrates a reset operation of the resistive memory device of the first embodiment;

FIG. 20 is a timing chart illustrating an auto-reset operation of the resistive memory device of the third embodiment.

DETAILED DESCRIPTION OF THE EMBODIMENTS

Figure 3:
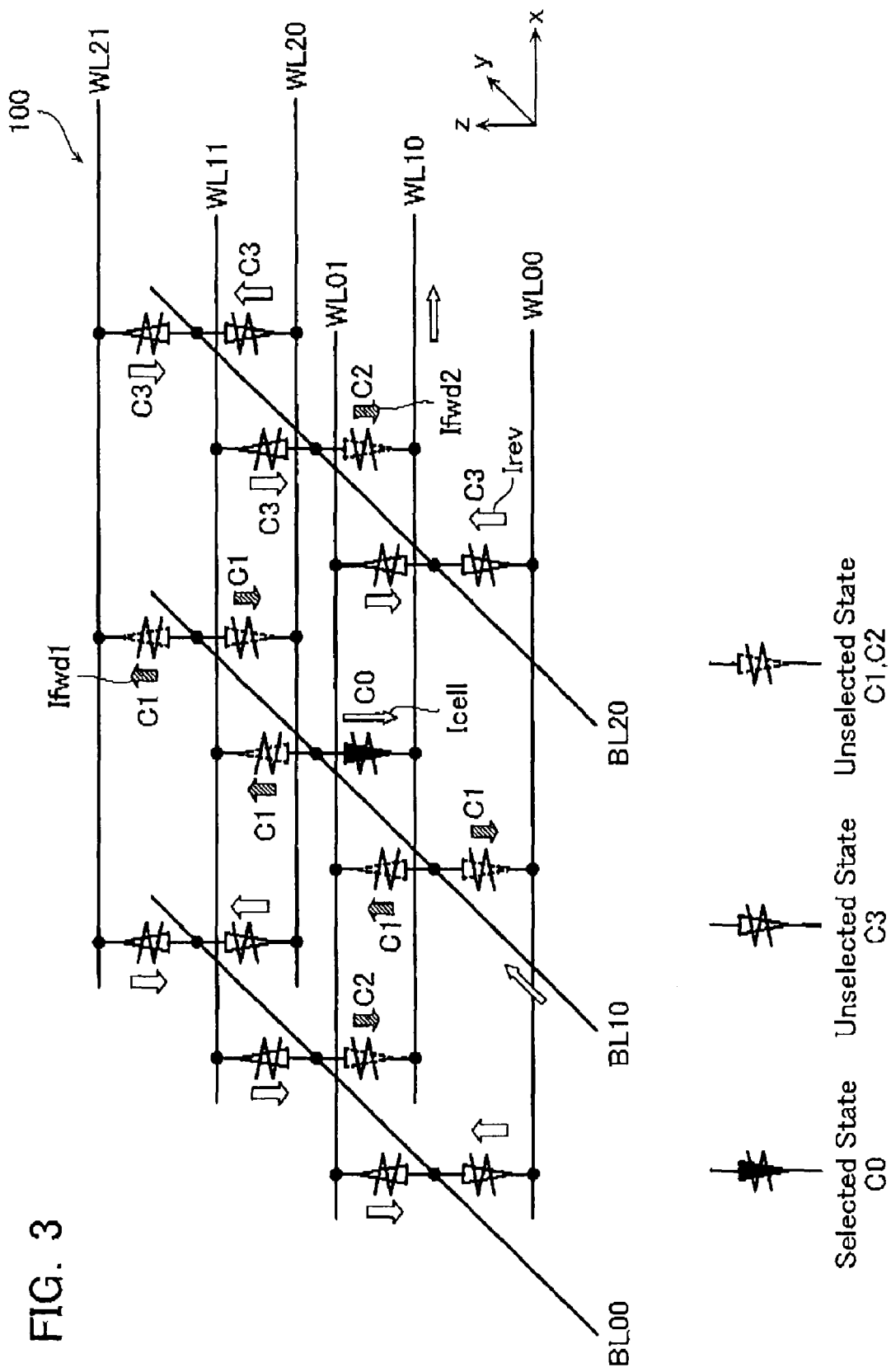
FIG. 3 illustrates a memory cell array of the resistive memory device according to embodiments of the present invention.

Embodiments of the present invention will now be described below with reference to the accompanying drawings. In the disclosed embodiments, a semiconductor storage device is described as a resistive memory device having a three-dimensional memory cell array structure with laminated memory cell arrays. Of course, this configuration, however, is intended to be exemplary only, and not a limitation upon the present invention.

First Embodiment (Configuration of Semiconductor Storage Device in First Embodiment)

FIG. 1A illustrates an example of partial layout of a memory cell array 100 of a resistive memory device according to a first embodiment of the present invention. As illustrated in FIG. 1A, the unipolar-type resistive memory device has resistive-type unit memory cells MC that include rectifier elements, such as diodes Di, and variable resistance elements VR connected in series, and that are positioned at respective intersections between bit lines BL and word lines WL intersecting each other. It is assumed herein that a signal line connected to the anode side of a diode Di represents a bit line BL, and another connected to the cathode side represents a word line WL. In addition, each memory cell MC including a diode Di and a variable resistance element VR connected in series is denoted by the symbols as illustrated in FIG. 1A. This also applies to the following examples. It should be appreciated that a diode Di and a variable resistance element VR included in a memory cell MC are not limited to the arrangement or polarity as illustrated in the figures. The memory cell array 100 of FIG. 1A has, e.g., $1 \times 10^3$ unit memory cells MC arranged therein, in the longitudinal directions of the bit line BL (y direction of FIG. 1A) and the word line WL (x direction of FIG. 1A), respectively. The memory cells MC are arranged in a two-dimensional matrix form.

The variable resistance elements VR, which have, for example, a structure of electrode/transition metal oxide/electrode, provide a change in resistance value of a metal oxide depending on the conditions of applied voltage, current, heat, etc., and store the different states of the resistance values as information in a non-volatile manner. More specifically, the following can be used as the variable resistance elements VR: changing resistance values with a phase transition between a crystalline state and an amorphous state, such as chalcogenide (PCRAM); changing resistance values by depositing metal cations to form a contacting bridge between electrodes, or ionizing the deposited metal to break down the contacting bridge (CBRAM: Conductive Bridging RAM); changing resistance values through application of voltage or current (ReRAM) (which is divided broadly into two types: one is the type where a resistance change occurs depending on the absence or presence of electric charges trapped by a charge trapping residing on the electrode interface; and the other is the type where a resistance change occurs depending on the absence or presence of a conductive path due to oxygen defect, etc.); and so on.

For unipolar-type ReRAM, data is written to a memory cell MC by applying, for on the order of 10 ns to 100 ns, a voltage of, e.g., 3.5V (in fact, on the order of 4.5V if a voltage drop in the corresponding diode Di is included) and a current of on the order of 10 nA to a variable resistance element VR. As a result, the variable resistance element VR changes from a high resistance state to a low resistance state. The operation of changing a variable resistance element VR from a high resistance state to a low resistance state is hereinafter referred to as the "set operation".

On the other hand, data is erased from a memory cell MC by applying, for on the order of 500 ns to 2 µs, a voltage of 0.8V (in fact, on the order of 1.8V if a voltage drop in the corresponding diode Di is included) and a current of on the order of 1 µA to 10 µA to a variable resistance element VR in its low resistance state after the set operation. As a result, the variable resistance element VR changes from a low resistance state to a high resistance state. The operation of changing a variable resistance element VR from a low resistance state to a high resistance state is hereinafter referred to as the "reset operation".

For example, a memory cell MC takes a high resistance state as a stable state (reset state) and data is written to the memory cell MC by such a set operation that causes a reset state to be switched to a low resistance state for binary storage.

A read operation from a memory cell MC is performed by applying a voltage of 0.4V (in fact, on the order of 1.4V if a voltage drop in the corresponding diode Di is included) to a variable resistance element VR, and monitoring at a sense amplifier a current flowing through the variable resistance element VR. As a result, it is determined whether the variable resistance element VR is in its low resistance or high resistance state. Note that if one memory cell MC can retain 2-bit data, then the sense amplifier generates three different reference voltages, which are compared with cell signals.

As illustrated in Table 1 of FIG. 1B, in operation of the resistive memory device, the bit lines BL and the word lines WL of the memory cell array 100 have four types of voltage application states. Accordingly, each memory cell MC also has four types of voltage application states. The following description is given of the voltage application states of a memory cell MC in the case of set operation. In FIG. 1A, the selected bit line BL and the selected word line WL are a bit line BL10 and a word line WL10, to which voltage Vset and voltage 0V are applied, respectively. Unselected bit lines BL and unselected word lines WL are bit lines BL00, BL20 and word lines WL00, WL20, to which voltage 0V and voltage Vset are applied, respectively.

A memory cell MC that is connected to the intersection between the selected bit line BL10 and the selected word line WL10 illustrated in FIG. 1A is hereinafter assumed to be in selected state, which is indicated by state C0. A set voltage Vset is applied between the bit line BL10 (voltage Vset) and the word line WL10 (voltage 0V) in the forward direction of the diode Di for the memory cell MC in selected state C0. As a result, a potential difference VSET is applied to the selected memory cell MC, and the variable resistance element VR changes from a high resistance state to a low resistance state, after which the set operation is completed.

Those memory cells MC that are connected to intersections between the selected bit line BL10 and the unselected word lines WL00, WL20 as illustrated in FIG. 1A are hereinafter assumed to be in unselected state, indicated by state C1. Similarly, other memory cells MC that are connected to intersections between the selected word line WL10 and the unselected bit lines BL00 and BL20 are hereinafter assumed to be in unselected state, indicated by state C2. The same voltage is applied to the unselected word lines WL00 and WL20 as that applied to the selected bit line BL10 (voltage Vset). Similarly, the same voltage is applied to the unselected bit lines BL00, BL20 as that applied to the selected word line WL10 (voltage 0V). Thus, the memory cells MC in unselected state C1 and C2 have no potential difference, and hence no current will flow therethrough.

In addition, those memory cells MC that are connected to intersections between the unselected word lines WL00, WL20 and the unselected bit lines BL00, BL20 illustrated in FIG. 1A are hereinafter assumed to be in unselected state, indicated by state C3. It is also assumed that a voltage is applied between the unselected word lines WL (voltage VSET) and the unselected bit lines BL (voltage 0V) for the memory cells MC in unselected state C3 in the reverse-bias direction of the diode Di, which may cause a reverse leakage current Irev (on the order of 0.1 nA) to flow through unselected memory cells MC. Since the memory cell array 100 has $10^3$ memory cells MC arranged therein in the bit line direction (y direction) and the word line direction (x direction), respectively, the total number of memory cells MC in unselected state C3 through which the reverse leakage current Irev will flow is about $10^3 \times 10^3 = 10^6$. Accordingly, the total reverse leakage current Irev is on the order of 100 µA.

As such, if the reverse leakage current Irev flows through the memory cells MC in unselected state C3, then it is necessary to provide a current that is equal to or greater than a certain amount of current required for the operation of the memory cells MC to the path of the corresponding bit lines BL, diodes Di, variable resistance elements VR, and word lines WL. This results in a larger voltage drop caused by the parasitic resistance of the bit lines BL and the word lines WL, limiting the size of the memory cell array 100. In other words, the voltage drop due to the bit lines BL and the word lines WL is a factor in determining the operational margin. In addition, if a plurality of memory cells MC are operated at the same time that are connected to the same word line WL, then a much larger current will flow into the word line WL, increasing the voltage drop due to the word line WL. Thus, the number of memory cells that can be operated at the same time is limited by the parasitic resistance included in the corresponding signal lines.

In addition, the resistive memory device requires unselected voltage to be applied to all unselected word lines WL that intersect the selected bit line BL. Accordingly, a reverse-bias voltage is applied to the diodes Di of all unselected memory cells MC connected to a plurality of unselected word lines WL. Particularly, in set operation requiring a higher voltage than other operations such as reset operation, a boost circuit is used to apply voltage to the unselected word lines WL if the set voltage exceeds the external power supply voltage, which would result in a significant increase in current consumption due to the boost circuit. That is, the acceptable current consumption must be taken into account to determine the size of the memory cell array 100, the number of cells to be operated at the same time, and so on.

This means that if the diode Di has poor reverse leakage current characteristics, then the memory cell array 100 will have an insufficient size and fewer memory cells could be operated at the same time. Since the number of memory cells that are operated at the same time affects the operating speed (e.g., in reset operation speed), it is necessary to improve the reserve leakage characteristics of the diode.

FIG. 2A illustrates other voltage application states of the memory cell array 100 in the resistive memory device according to the first embodiment of the present invention. In FIG. 2A, the same reference numerals represent the same components as FIG. 1A, and description thereof will be omitted. The memory cell array 100 illustrated in FIG. 2A is different from that previously described in FIG. 1A in the voltage to be applied to unselected bit lines BL and unselected word lines WL.

As illustrated in Table 2 of FIG. 2B, the voltages applied to unselected word lines WL in set and reset operations are changed from Vset and Vreset to Vset-Vα and Vreset-Vα. In this case, the voltage Vα is, e.g., on the order of 0 to 0.5V. In addition, voltage VR of on the order of 0 to 0.5V is applied to unselected bit lines BL in set and reset operations.

When such voltage is applied to the unselected word lines WL and the unselected bit lines BL, the voltage Vα is applied between the bit line BL10 (voltage VSET) and the word lines WL00, WL20 (voltage VSET-Vα) in the forward direction of the diode Di for the memory cells MC in unselected state C1. Then, a forward current Ifwd1 (e.g., on the order of 0.1 nA) flows through the memory cells MC in unselected state C1. Similarly, the voltage Vβ is applied between the bit lines BL00, BL20 (voltage Vβ) and the word line WL10 (voltage 0V) in the forward direction of the diode Di for the memory cells MC in unselected state C2, and a forward current Ifwd2 (e.g., on the order of 0.1 nA) flows through the memory cells MC in unselected state C2. In addition, another voltage is applied between the unselected word lines WL (voltage VSET-Vα) and the bit line BL (voltage Vβ) in the reverse-bias direction of the diode Di for the memory cells MC in unselected state C3. This voltage in the reverse-bias direction is smaller than in the state of FIG. 1B by voltage Vα+Vβ (e.g., on the order of 1V). Thus, the reverse leakage current Irev flowing through the memory cells MC in unselected state C3 is, e.g., on the order of 0.1 pA.

Since the memory cell array 100 has $10^3$ memory cells arranged therein in the bit line direction (y direction) and the word line direction (x direction), respectively, the total number of memory cells in unselected state C1 and C2 through which the forward currents Ifwd1 and Ifwd2 flow is about $2 \times 10^3$. Accordingly, the total of the forward currents Ifwd1 and Ifwd2 is on the order of 0.2 μA. In addition, since the total number of memory cells MC in unselected state C3 through which the reverse leakage current Irev flows is about $10^3 \times 10^3 = 10^6$, the total reverse leakage current Irev is on the order of 0.1 μA. Thus, the total of the forward currents Ifwd1 and Ifwd2 together with the reverse leakage current Irev flowing through the entire memory cell array 100 is on the order of 0.3 μA. According to the voltage application method as illustrated in FIG. 2B, a smaller current may flow through the entire memory cell array 100 than the example of FIG. 1B.

This voltage application method will only unnecessarily consume more currents unless the reverse leakage current of the diode is reduced. Therefore, overall effects of reducing leakage current should be considered to determine the values of voltage Vα and Vβ. If the diode has a reverse leakage current different from the above-mentioned case, then the voltage application method of FIG. 1B may be employed by setting the values of voltage Vα and Vβ to 0, respectively. The resistive memory of this embodiment may employ either voltage application methods illustrated in FIG. 1B or FIG. 2B.

Now, a structure where the resistive memory device has memory cell arrays 100 laminated in a three-dimensional manner is explained below. FIG. 3 illustrates an example structure where memory cell arrays 100 are laminated in a three-dimensional direction (z direction in FIG. 3). In FIG. 3, two layers of memory cell arrays 100 are laminated, one of which is as illustrated in FIG. 1A and FIG. 2A.

A memory cell array 100 on the first layer includes: word lines WL00 to WL20 provided on a first wiring layer on the bottom; bit lines BL00 to BL20 provided on a second wiring layer; and memory cells MC positioned at intersections between the word lines WL00 to WL20 and the bit lines BL00 to BL20. Another memory cell array 100 on the second layer includes: the bit lines BL00 to BL20; word lines WL01 to WL21 provided on a third wiring layer; and memory cells MC positioned at intersections between the bit lines BL00 to BL20 and the word lines WL01 to WL21. In the memory cell arrays 100 illustrated in FIG. 3, the bit lines BL00 to BL20 are shared by two layers located one above the other. If a cell current Icell is caused to flow from a selected bit line BL to a selected word line WL for different operations as in the memory cell array 100 illustrated in FIGS. 1A and 2A, the diodes Di in the memory cell array 100 on the first layer are oppositely oriented in relation to those in the memory cell array 100 on the second layer. In this case, the selected bit line BL and the selected word line WL are the bit line BL10 and the word line WL10, to which voltage Vset and voltage 0V are applied in set operation, respectively. In addition, the voltage applied to the unselected word lines WL is Vset-Vα, and voltage Vβ is applied to the unselected bit lines BL.

FIG. 3 illustrates a case where two layers of memory cell arrays 100 are formed in the vertical direction (z direction). In order to laminate more layers, the word lines WL provided on the third wiring layer may be shared by the upper memory cell array 100, or additional memory cell arrays 100, as illustrated in FIG. 3, may be laminated via intervening interlayer insulation films. Alternatively, a memory cell array 100 of one layer, as illustrated in FIG. 2A, may be laminated one after another via an intervening interlayer insulation film.

In that case, depending upon how the bit lines BL and the word lines WL are shared between the memory cell arrays 100 laminated one above the other, the number of corresponding memory cells MC as well as the reverse leakage current Irev of the diodes Di increase. While FIG. 3 illustrates the lamination of two layers of memory cell arrays 100, the number of memory cells MC in unselected state C3 through which the reverse leakage current Irev will flow is about twice as many as that in FIG. 2A, because the bit lines BL are shared between the layers. However, the voltage application method of FIG. 2B may reduce the reverse leakage current Irev of the memory cells MC in unselected state C3. In addition, even in a structure with laminated cell arrays, depending upon the reverse leakage current characteristics of the diodes, the voltage application method as illustrated in FIG. 1B may also be employed.

Referring now to FIGS. 4 to 7, the following description is given of the voltages and currents that are caused in a memory cell MC in selected state during set, reset, and read operations of the resistive device.

Figure 4:
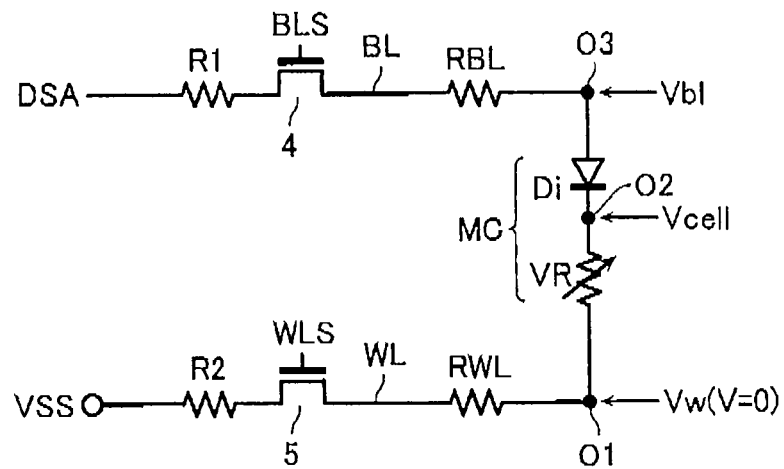
FIG. 4 illustrates an operation of a memory cell of the resistive memory device according to embodiments of the present invention.

FIG. 4 schematically illustrates the current path of one memory cell MC positioned at an intersection between one bit line BL and one word line WL. One end of the bit line BL is connected to one end of a bit-line selection transistor 4, and one end of the word line WL is connected to one end of a word-line selection transistor 5. Note that resistance RBL and RWL illustrated in FIG. 4 represent the parasitic resistance of the bit line BL and the word line WL, respectively. The other end of the bit-line selection transistor 4 is connected via a parasitic resistance R1 to a wiring node DSA that is connected to a data control circuit (not illustrated). In addition, the other end of the word-line selection transistor 5 is connected via a parasitic resistance R2 and on-resistance of a grounding transistor (not illustrated) to a ground terminal VSS.

Figure 5:
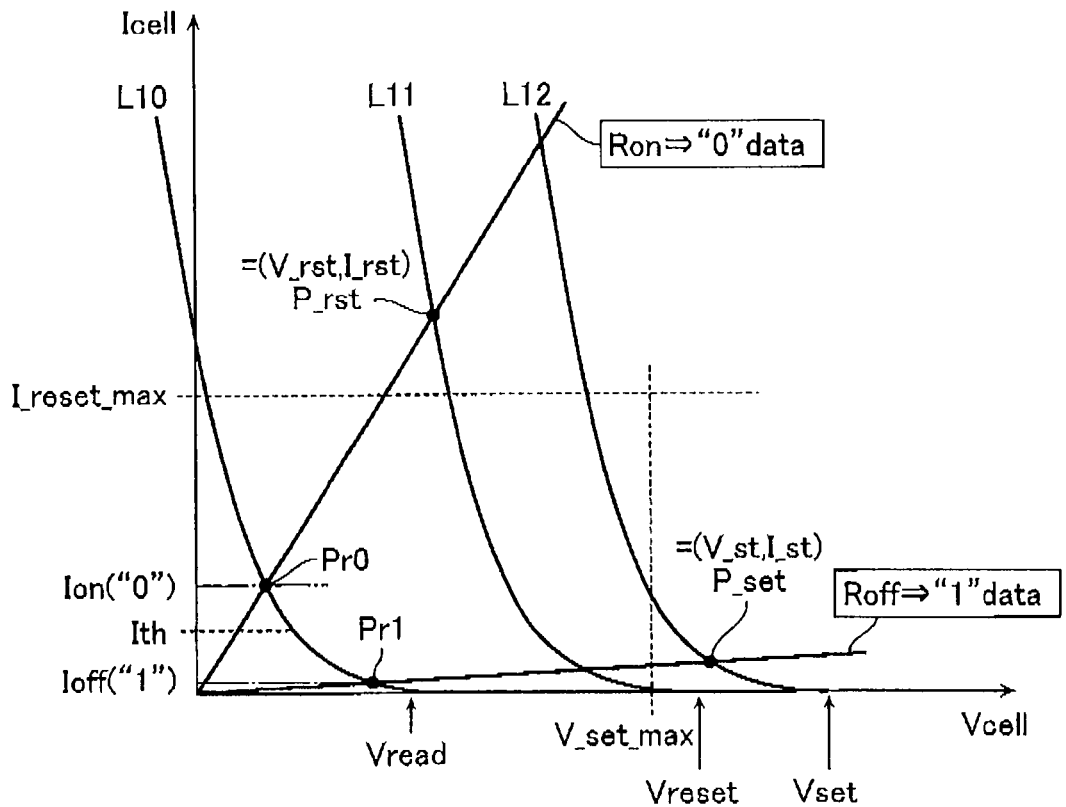
FIG. 5 illustrates the voltage and current generated in a memory cell MC during set, reset, and read operations.

Referring now to FIG. 5, an analysis diagram is illustrated for analyzing operating points of set, reset, and read operations. In FIG. 5, it is assumed that a node O2 between the variable resistance element VR and the diode Di has a potential of Vcell and a node O3 at the anode side of the diode Di has a potential of Vbl, in relation to the potential Vw (Vw=0V) of a node O1 at one end of the memory cell MC. FIG. 5 illustrates the voltage-current characteristics (V=IR) of the variable resistance element VR in reset state (high resistance state Roff) and set state (low resistance state Ron), overlaid by load curves L10, L11 and L12 of the diode Di. In addition, the horizontal axis of the graph in FIG. 5 represents voltage Vcell and the vertical axis thereof represents cell current Icell.

Firstly, in set operation, the current flowing through the memory cell MC when the potential Vbl=Vset is given to the node O3 is plotted with an operating point of P_set. This operating point P_set is for changing the memory cell in a high resistance state Roff ("1" data) to a low resistance state Ron ("0" data). This operating point P_set is the one before the set operation is completed. The operating point P_set should be set at a point greater than the voltage (V_set_max) that allows for setting all memory cells MC.

Then, in reset operation, if the potential Vbl=Vreset is given to the node O3, the operating point becomes a point P_rst, as illustrated in FIG. 5. This operating point P_rst is to change the memory cell in a low resistance state Ron ("0" data) to a high resistance state Roff ("1" data). The operating point P_set should be set at a point greater than the current (I_reset_max) that allows for resetting all memory cells MC.

Note that if potential Vbl=Vread at the node O3 in read operation, then the operating point is Pr0 or Pr1. Accordingly, a determination current Ith that distinguishes between the cell currents Ion ("0" cell) and Ioff ("1" cell) flowing at this point may be used to determine whether data is "0" or "1".

Figure 6:
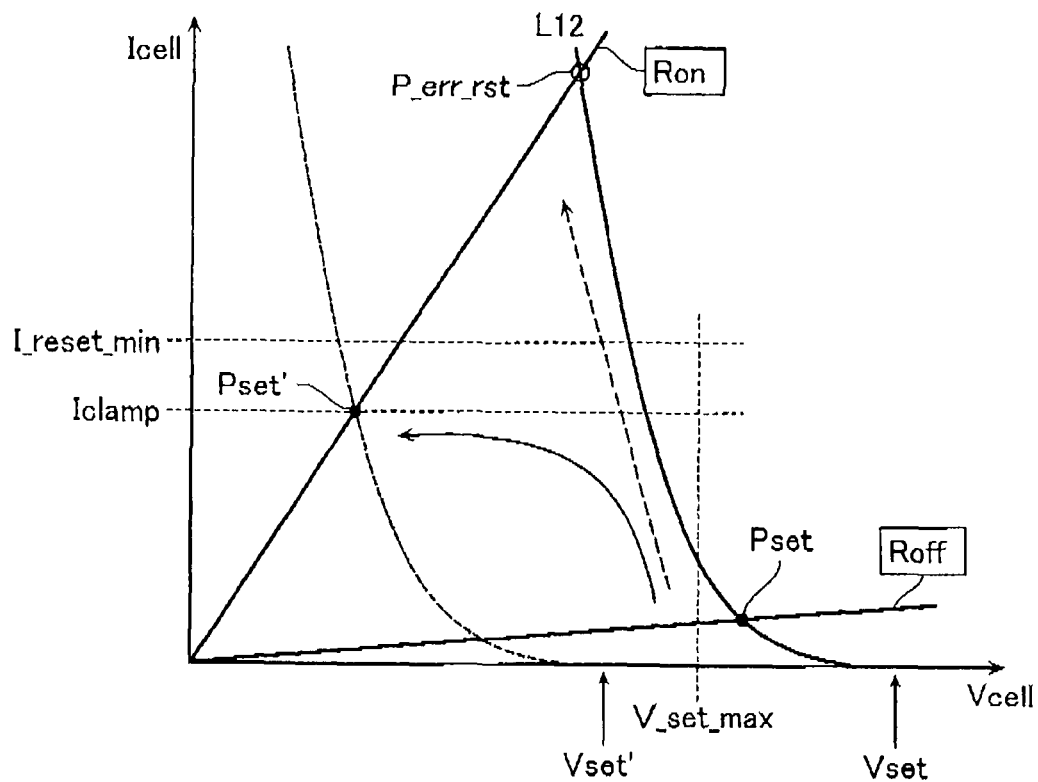
FIG. 6 illustrates the voltage and current generated in a memory cell MC during set, reset, and read operations.
Figure 7:
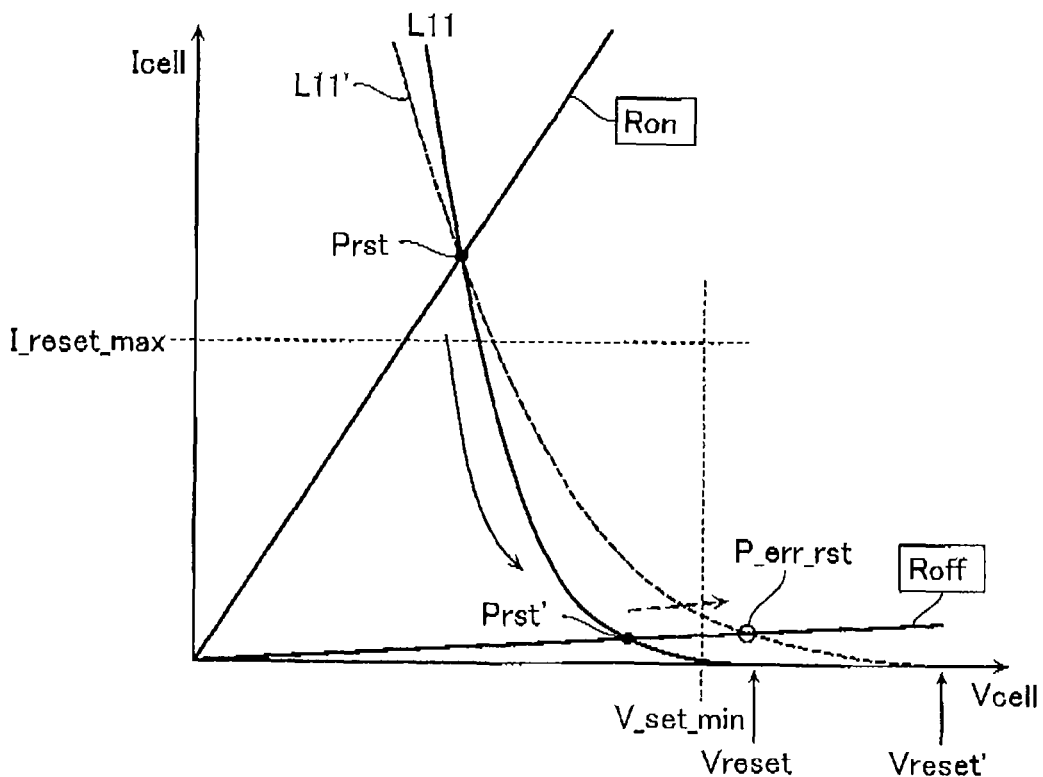
FIG. 7 illustrates the voltage and current generated in a memory cell MC during set, reset, and read operations.

Referring now to FIGS. 6 and 7, the problems associated with reset and set operations will be described below.

FIG. 6 illustrates operating points of set operation before and after the completion of a set operation. If the variable resistance element VR of the memory cell MC is in a high resistance state Roff, then the operating point is located at Pset. Then, upon completion of the set operation, and after the memory cell MC changed to a low resistance state Ron, the current flowing through the memory cell MC is controlled so that the operating point is changed to the point Pset', rather than the point P_err rst. This is because the operating point P_err_rst is beyond the current I_reset_min, and if the operation continues at this operating point, then the memory cell can be erroneously reset again (erroneous reset) immediately after the completion of setting. Therefore, a current clamp circuit is inserted into the circuit for supplying a set voltage Vset so that the operating point after the set operation will not be P_err_rst, thereby preventing any current equal to or greater than a clamp current Iclamp from flowing through the memory cell. If the clamp current Iclamp is set to be smaller than the current I_reset_min that is required for reset operation of the memory cell MC, then the possibility of occurrence of erroneous reset will be very small.

Next, FIG. 7 illustrates operating points of reset operation before and after the completion of a reset operation. In reset operation, the operating point moves to Prst' after changing from Prst in a low resistance state Ron (before the completion of reset operation) to a high resistance state Roff (after the completion of reset operation). In this case, in order to perform a reset operation, the voltage Vreset needs to be applied to the corresponding bit line BL for setting an operating point greater than a current I_reset_max required for resetting. At this point, if there is a large parasitic resistance in the entire current path along which the reset current flows, then the characteristics of the current flowing through the diodes Di is illustrated by a load curve L11'. A load curve L11 in FIG. 7 is a load curve when there is a small parasitic resistance in the entire current path. This in fact requires voltage Vreset' which is higher than Vreset to be given as the maximum potential difference of the current path. However, when this is done, the operating point becomes P_err_rst after the completion of reset operation. Because this operating point P_err_rst is beyond the voltage V_set_min for set operation of the memory cell, then the memory cell MC can be erroneously set again (erroneous setting) immediately after the completion of the reset operation.

Hereinbelow, an embodiment of the resistive memory device will be described that effectively prevents the occurrence of such erroneous setting after the reset operation of the memory cell.

Figure 8:
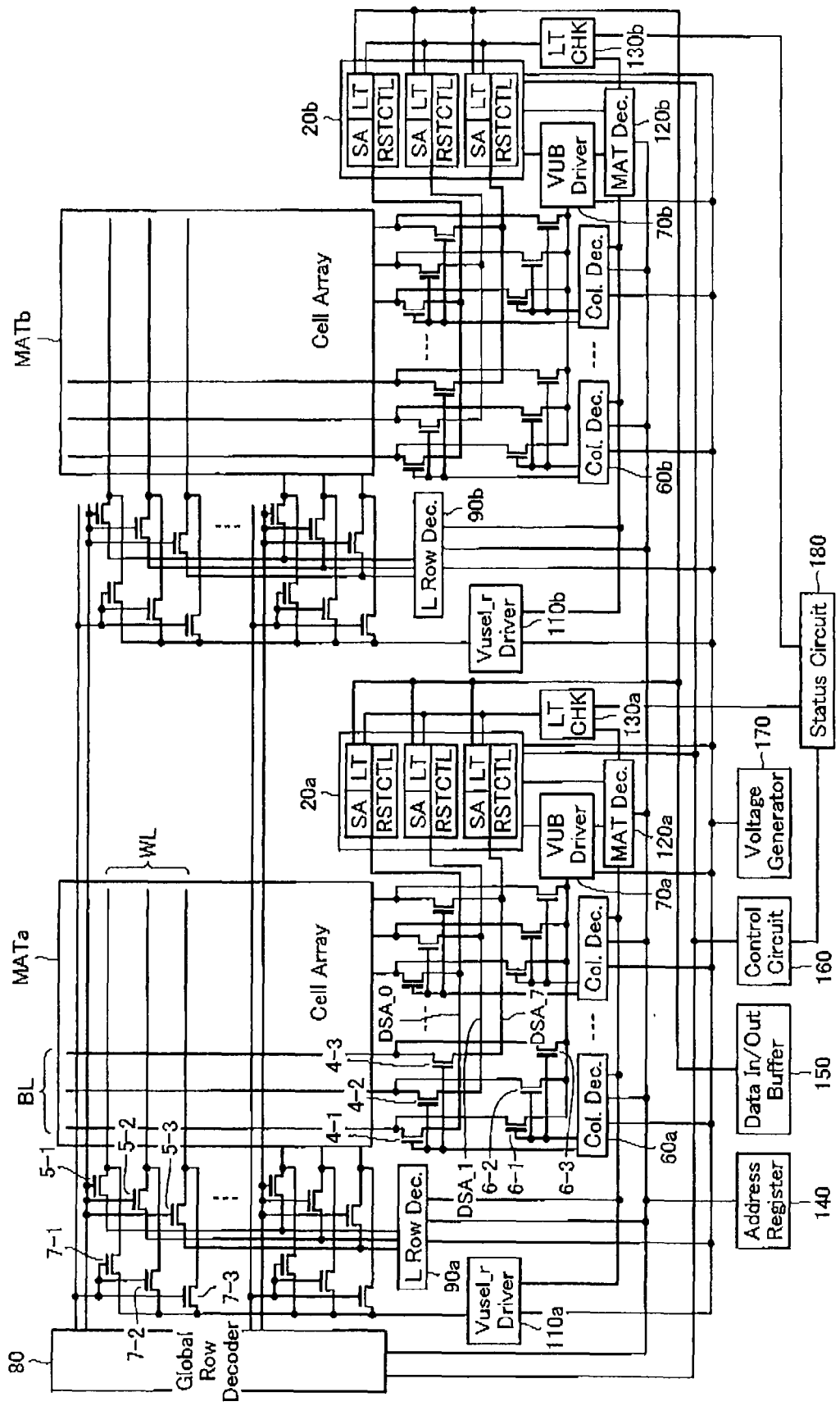
FIG. 8 is a circuit diagram illustrating the configuration of peripheral circuits of the resistive memory device according to the first embodiment of the present invention.

FIG. 8 illustrates the configuration of peripheral circuits of the resistive memory device according to this embodiment. In this case, two memory cell arrays (which are referred to hereinafter as "memory mats MAT") MATa and MATb are typically illustrated in which the above-mentioned memory cells MC are arranged. In this embodiment, operations may be performed on only one memory mat MATa, or a plurality of memory mats MATa and MATb may be operated at the same time. Alternatively, the plurality of memory mats MATa and MATb may be operated sequentially in a certain order each time an address is specified or operation is activated.

The peripheral circuits include data control circuits 20, column decoders 60, unselected bit-line driving circuits 70, a global row decoder 80, local row decoders 90, unselected word-line driving circuits 110, mat decoders 120, latch data check circuits 130, an address register 140, a data input/output buffer 150, a control circuit 160, a voltage generation circuit 170, and a status circuit 180. Note that those components required for each memory mat MAT, such as column decoders 60 or local decoders 90, are distinguished from each other with indexes "a" and "b" in FIG. 8.

The bit lines BL are connected to the data control circuits 20 via respective bit-line selection transistors 4-1 to 4-3. As described below, each data control circuit 20 comprises: sense amplifier circuits SA for detecting read data; latch circuits LT for temporarily retaining the read data and written data; and reset pulse control circuits RSTCTL. The bit lines BL are also connected to unselected voltage source transistors 6-1 to 6-3. If a bit line BL is not selected, the bit line BL is connected to the corresponding unselected bit-line driving circuit 70 via the unselected voltage source transistors 6-1 to 6-3. Then, a certain unselected bit-line voltage is supplied to the bit line BL depending upon the operation.

In addition, the word lines WL are connected to the local row decoders 90 via respective word-line selection transistors 5-1 to 5-3. The word lines WL are also connected to the unselected voltage source transistors 7-1 to 7-3. If a word line WL is not selected, the word line WL is connected to the corresponding unselected word-line driving circuit 110 via the unselected voltage source transistors 7-1 to 7-3. Then, a certain unselected word-line voltage is supplied to the word line WL depending upon the operation.

FIG. 8 illustrates a hierarchical structure of row decoders, including the global row decoder 80 and the local row decoders 90 associated with the respective memory mats MATa and MATb, which provides for selection of word lines. Note that in the row decoders of FIG. 8, both the word-line selection transistors 5-1 to 5-3 and the unselected voltage source transistors 7-1 to 7-3 are NMOS transistors. In this case, output signals from the global row decoder 80 represent complementary signals for driving respective gates of the transistors, although not illustrated in the figure. Similarly, both the bit-line selection transistors 4-1 to 4-3 and the unselected voltage source transistors 6-1 to 6-3 are also NMOS transistors, and two complementary signals are output from the column decoders 60 for controlling the respective gates.

Note that the bit-line selection transistors 4-1 to 4-3 and the unselected voltage source transistors 7-1 to 7-3 may be PMOS transistors. In that case, the decode signal that is output from the column decoders 60 and the global row decoder 80 may be a single signal rather than complementary signals. Whether PMOS transistors can be used for the bit-line selection part and the word-line selection part is determined by whether the voltage to be transferred is sufficiently larger than the threshold voltage of the PMOS transistors.

For the bit-line selection part, if PMOS transistors are used for the bit-line selection transistors 4-1 to 4-3, then the voltage to be output to the bit lines must be not less than the threshold voltage Vth of PMOS transistor plus a margin. What is the smallest voltage for the selected bit line in reading is Vread in read operation. For example, adding 0.4V to the threshold voltage Vth (on the order of $-0.7$ to $-1$V) of PMOS transistor as a margin results in 1.4V or more, and if this is not considered to be problematic for the operational setting in read operation, PMOS transistors may successfully be used.

In addition, for the word-line selection part, PMOS transistors may be used for the unselected voltage source transistors 7-1 to 7-3. What is the smallest voltage to be output to the unselected word lines WI, is Vread in read operation. Since the voltage applied to the unselected word lines WL may be higher than the read voltage Vread to be applied to the selected bit line BL, it is easier to use PMOS transistors for the unselected voltage source transistors 7-1 to 7-3 than in the bit-line selection part. While this embodiment will be hereinafter described in the context of the bit-line selection transistors 4-1 to 4-3 and the unselected voltage source transistors 7-1 to 7-3 as NMOS transistors, it is not so limited.

The mat decoders 120 are decoders for selecting a memory mat MAT. In an unselected memory mat MAT, both bit lines BL and word lines WL may be at 0V as long as the bit lines BL and the word lines WL are not shared with the neighboring memory mat MAT. When a memory mat MATa is selected and a memory mat MATb is not selected, a mat decoder 120a outputs a decode signal MATSEL=H which represents selected state, while a mat decoder 120b outputs a decode signal MATSEL=L which represents unselected state. As a result, the above-mentioned voltage control required for rewriting data in read, set, and reset operations is performed on the bit lines BL and the word lines WL at the selected memory mat MATa.

On the other hand, at the unselected memory mat MATb, in response to the output signals from the mat decoder 120b, all of the output signals from a local row decoder 90b are 0V and spare those from an unselected word-line driving circuit 110b, as long as the bit lines BL and the word lines WL are not shared with the neighboring memory mat MAT. In addition, all of the output signals (the potentials of the node DSA) from a data control circuit 20b are also controlled to be 0V and so are those from an unselected bit-line driving circuit 70b. Of course, the memory mats MATa and MATb may also be in selected state at the same time.

The column decoders 60, the global row decoder 80, the local row decoders 90, and the mat decoders 120 operate based on the address data provided by the address register 140. Although details are not given, as with the other common memory devices, any circuits may be incorporated between the address register 140 and different decoders to suit a particular implementation, such as pre-decoder circuits or buffers for temporarily latching addresses, as deemed appropriate.

The data input/output buffer 150 relays data communication between the outside of the chip and the circuits inside the chip leading to the latch circuits LT of the data control circuits 20, and temporarily stores data as needed. As with NAND-type flash memory, such a circuit configuration may be employed where other data such as commands or addresses are also captured inside the chip via the data input/output buffer 150. In addition, the operations for rewriting data, reading data or the like are controlled by different control signals output from the control circuit 160 and by voltages output from the voltage generation circuit 170. The latch data check circuits 130 and the status circuit 180 are provided as circuits for playing a supplementary role in controlling the operations. They have the following functions: detecting whether or not data retained in a data latch of the data control circuit is in a certain state, which is fed back to the control circuit 160; and allowing Pass/Fail results of data rewriting operation to be output to the outside of the chip.

Figure 9:
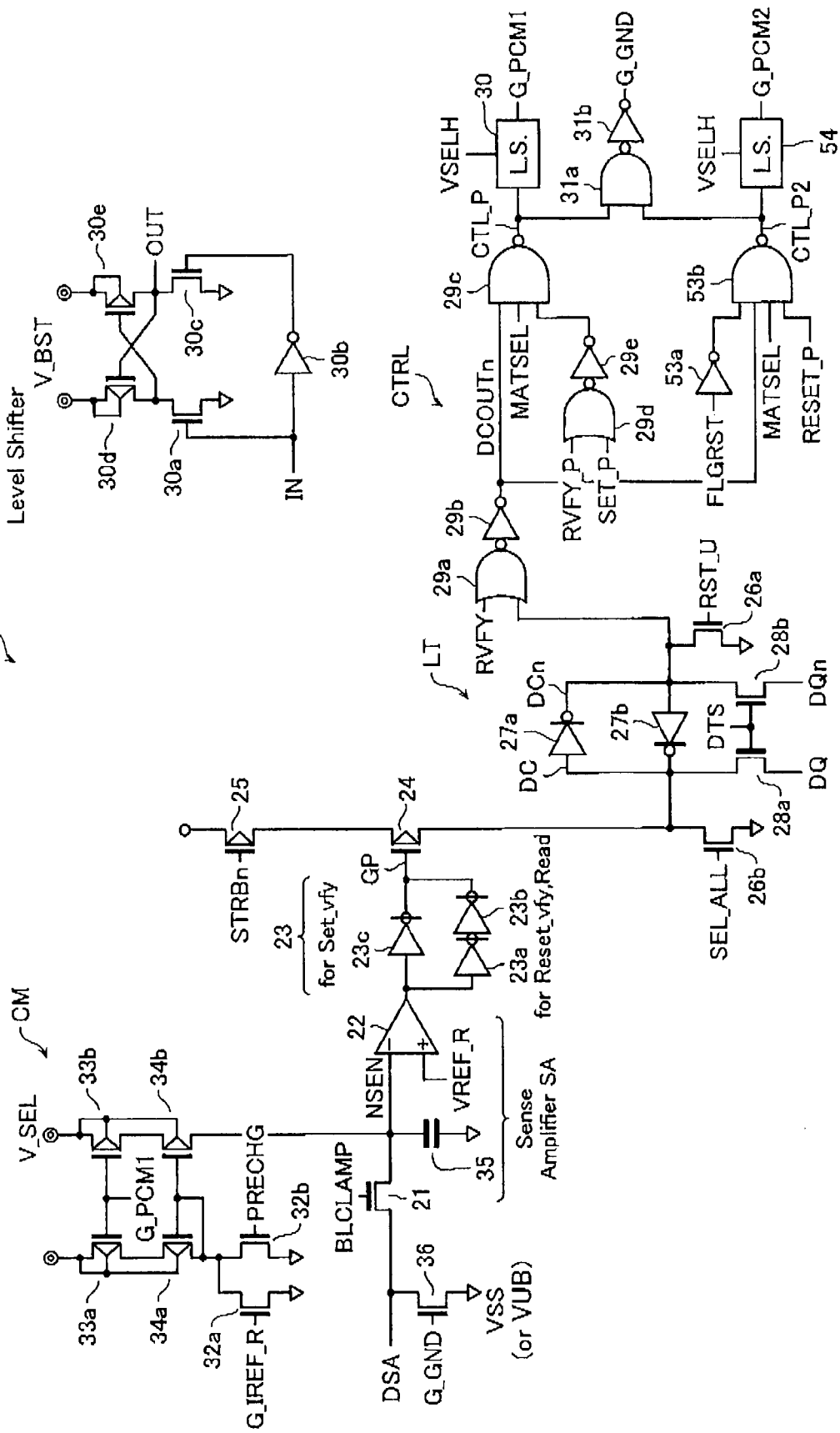
FIG. 9 is a circuit diagram illustrating details of a data control circuit of the first embodiment.

Referring now to FIG. 9, the data control circuits 20 will be described in detail below. Briefly, as described above, each data control circuit 20 includes sense amplifier circuits SA, latch circuits LT, and reset pulse control circuits RSTCTL.

Each sense amplifier circuit SA comprises a clamp transistor 21 and a differential amplifier 22. The clamp transistor 21 has its one end connected to a node DSA and the other end to an inverting input terminal (sense node NSEN) of the differential amplifier 22. Although not illustrated in FIG. 9, the node DSA is connected the bit lines BL via the above-mentioned bit-line selection transistors 4. The differential amplifier 22 has a non-inverting input terminal to which a reference potential VREF_R is supplied.

Note that a capacitor 35 and a NMOS transistor 36 are connected between the node DSA and aground terminal (or, a VUB terminal (to which 0V to diode's forward direction voltage Vf (on the order of 0.6V) is applied)). The NMOS transistor 36 has a function for discharging the node DSA to the ground potential (or, the potential of the VUB terminal) when a short signal G_GND described below is input to the gate.

In addition, the sense node NSEN is connected to a current mirror circuit CM including NMOS transistors 32a, 32b, and PMOS transistors 33a, 34a, 33b, 34b. The PMOS transistors 33*a*, 34*a*, 33*b* and 34*b* are included in the current mirror circuit having a switch control function, and the NMOS transistors 32*a* and 32*b* are connected in parallel between the PMOS transistor 34*a* and the ground terminal, thereby supplying current to the current mirror circuit. The NMOS transistor 32*a* becomes conductive based on a signal G_IREF_R when a reference current is input to the node DSA, while the NMOS transistor 32*b* becomes conductive based on a signal PRECHG when precharging the selected bit line BL, which will be discussed later.

The basic operation of the sense amplifier circuit SA is as follows: A cell current Icell flows into the selected memory cell MC, while clamping the potential of the bit line BL by the clamp transistor 21. A reference current flows into the sense node NSEN from the current mirror circuit CM. The differential amplifier 22 determines any change in the potential of the sense node NSEN according to the difference between the cell current Icell and the reference current.

An output signal of the differential amplifier 22 is captured by the latch circuit LT as an output signal of the sense amplifier circuit SA. The latch circuit LT includes cross-coupled clocked inverters 27*a* and 27*b*. Note that the input terminal of the clocked inverter 27*a* is defined as a node DC and the output terminal as a node DCn. The nodes DC and DCn of the latch circuit LT are connected to NMOS transistors 28*a* and 28*b*. Data of the latch circuit LT is output to data lines DQ and DQn by signals DTS input to the gates of the transistors 28*a* and 28*b*.

The NMOS transistor 26*a* sets the node DC to "H" level with a gate signal RST_U. Conversely, the transistor 26*b* sets the node DC to "L" level with a gate signal SEL_ALL.

The node DC is further connected to two PMOS transistors 24 and 25 that are connected in series for capturing an output signal of the differential amplifier 22 at the latch circuit LT. The PMOS transistor 24 has a gate GP to which an output signal from the differential amplifier 22 is input via a data transfer circuit 23. The PMOS transistor 25 is connected between the source of the PMOS transistor 24 and the power supply terminal (which is common to the power supply terminal of the latch circuit LT). The PMOS transistor 25 is adapted to change the node DC to "H" level when the gate signal STRBn turns to "L" level. That is, if the node GP is at "L" level, then the node DC can be changed to "H" level; and if the node GP is at "H" level, then the node DC maintains its previous state.

The configuration of a voltage control circuit CTRL for controlling the bit lines BL based on the state of the latch circuit LT will now be described below. Each voltage control circuit CTRL comprises: a NOR gate 29*a*; an inverter 29*b*; a NAND gate 29*c*; a NOR gate 29*d*; an inverter 29*e*; a level shifter 30; a NAND gate 31*a*; an inverter 31*b*; an inverter 53*a*; a NAND gate 53*b*; and a level shifter 54.

The NOR gate 29*a* and the inverter 29*b* function as the logic gate part for preventing outputs of the latch circuit LT from affecting the control of the bit lines BL when the signal RVFY is at "H" level (i.e., when a read operation is performed, and when a verify operation is performed (referred to hereinafter as a "read-type operation")). That is, although one input terminal of the NOR gate 29*a* is connected to a node DCn, the state of the node DCn will be ignored when the signal RVFY is at "H" level. This means that in read-type operation, a read operation can be performed at a certain data control circuit 20 that is determined by the signal RVFY, independently of data retained in the latch circuit LT.

As illustrated in FIG. 8, the semiconductor storage device includes a plurality of data control circuits 20, and the signals RVFY of the data control circuits 20 may be grouped based on addresses, data input/output terminals I/O, and so on (e.g., RVFY_a, RVFY_b). If all the data control circuits 20 have the same signal, then all data control circuits 20 are activated for a read-type operation. For example, if the signal RVFY_a and the signal RVFY_b are separately controlled, then a data control circuit 20 to which the signal RVFY_a is input is only activated, while the signal RVFY_b will not operate. That is, only a data control circuit 20 to which a certain signal is input can be activated. This is because it is desirable that verify and read operations are performed under as nearly the same conditions as possible. In addition, the grouping of signals RVFY is to limit the number of data control circuits 20 to be activated, while at the same time allowing adjustment of the amount of currents flowing from bit lines to word lines. On the other hand, the data control circuit 20 may be controlled based on data of the latch circuit LT, unless the signal RVFY is set to "H".

An output signal DCOUTn of the inverter 29*b* is input to the NAND gate 29*c* together with a signal MATSEL. The signal MATSEL is a signal that is set to "L" level during standby state or when the corresponding memory mat MAT is not selected. When the signal MATSEL is set to "L" level, signals G_PCM1 and G_PCM2 are set to "H" level via the level shifter 30, which causes PMOS transistors 33*a*, 33*b*, and 43*a*, 43*b* to turn off, and blocks the path for charging the node DSA. In addition, the signal G_GND is set to "H" via the NAND gate 31*a* and the inverter 31*b*, the NMOS transistor 36 is set to on-state, and the node DSA is discharged to the ground potential or the potential of the VUB terminal.

Furthermore, an output signal CTL_P of the NAND gate 29*c* and an output signal CTL_P2 of the NAND gate 53*b* represent the input signals of the NAND gate 31*a*. An output signal of the NAND gate 31*a* is further input to the inverter 31*b*, which in turn outputs a signal G_GND as mentioned above. If both of the signals CTL_P and CTL_P2 are set to "H" level, then the signal G_GND for controlling the discharge operation of the node DSA is controlled by an output signal of the NAND gate 29*c*.

Note that the level shifter 30 is a circuit that includes, for example, NMOS transistors 30*a*, 30*c*, PMOS transistors 30*d*, 30*e*, and an inverter 30*b* connected as illustrated in FIG. 9. The transistors 30*a*, 30*d*, and the transistors 30*c*, 30*e* are connected between the power supply terminal and the ground terminal, and the gates and drains of the transistors 30*d* and 30*e* are cross-connected. The gate of the transistor 30*a* is connected to the input terminal of the level shifter 30. The gate of the transistor 30*c* is connected the input terminal via the inverter 30*b*.

An output signal G_PCM1 output from the output terminal OUT of the level shifter 30 has amplitude of voltage V_BST after level shifting. Although not illustrated in the figure, the power supply before level shifting is the same as that of the inverter 30*b* (e.g., Vdd). The level shifter 30 has an input terminal IN to which the above-mentioned signal CTL_P is input, and a signal V_SEL corresponds to the above-mentioned voltage V_BST. The level shifter 54 has the same circuit configuration as that of the level shifter 30. An output signal G_PCM2 of the level shifter 54 controls a P-channel transistor that represents the switch of a path for charging a reset pulse control circuit RSTCTL described below.

Figure 10:
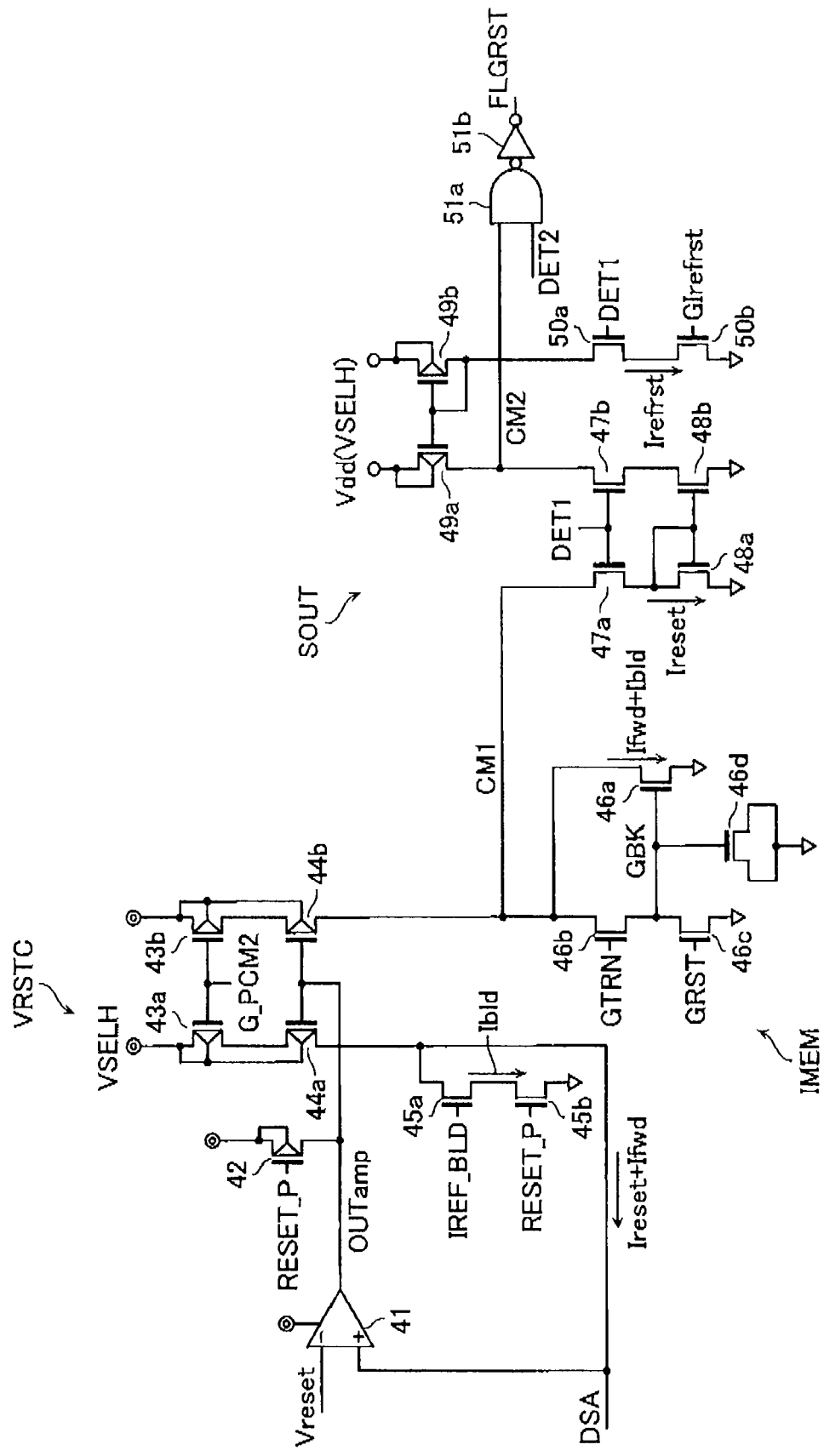
FIG. 10 is a circuit diagram illustrating details of a data control circuit of the first embodiment.

Referring now to FIG. 10, the circuit configuration of each reset pulse control circuit RSTCTL of the data control circuit 20 will be described in detail below. Each reset pulse control circuit RSTCTL includes a reset voltage setting circuit VRSTC, a current retaining circuit IMEM, and a signal output circuit SOUT. The entire reset pulse control circuit RSTCTL has a function for applying a reset pulse having a certain current and voltage required for reset operation to the node DSA to which the selected memory cell MC for reset operation is connected.

(Configuration of Reset Voltage Setting Circuit VRSTC)

The reset voltage setting circuit VRSTC is a circuit that sets the voltage of the bit line BL connected to the node DSA to a reset voltage Vreset. The reset voltage setting circuit VRSTC comprises a differential amplifier 41 having an inverting input terminal to which the reset voltage Vreset is supplied. The differential amplifier 41 has a non-inverting input terminal to which the node DSA is connected and the potential of the bit line BL is supplied. The differential amplifier 41 has an output node OUTamp to which a current mirror circuit is connected including PMOS transistors 44a, 44b, 43a, and 43b. As illustrated in FIG. 10, the output node OUTamp is connected to the gates of the current-mirror-connected PMOS transistors 44a and 44b. The PMOS transistors 43a and 43b, which are output switches of reset pulses, will be first on/off controlled according to the data of the latch circuit LT described in FIG. 9. When the PMOS transistors 43a and 43b are in on-state, a reset pulse is applied to the memory cell MC. When the memory cell MC is changed to a high resistance state Roff, the gate signal G_PCM2 is set to "H" level based on the current detection result described below to turn off the PMOS transistors 43a and 43b. If the signal G_PCM2 is in "L" level, the PMOS transistors 43a and 43b become conductive, continually applying a reset voltage. The reset voltage setting circuit VRSTC takes the reset voltage Vreset as a reference voltage and maintains the potential of the node DSA at the voltage Vreset by the power supply VSELH.

In this case, a current Ireset+Ifwd flowing through a bit line BL in reset operation is equal to a reset current Ireset causing a reset operation of the selected memory cell MC plus a forward current Ifwd flowing through the unselected memory cells MC illustrated in FIGS. 2A and 3.

In the reset voltage setting circuit VRSTC, the PMOS transistor 42 connected to the output node OUTamp is a pull-up transistor that maintains the output node OUTamp at a certain voltage while the reset voltage setting circuit VRSTC ceases its operation. In addition, NMOS transistors 45a and 45b are connected in series between the PMOS transistor 44a and the ground terminal of the current mirror circuit. The NMOS transistors 45a and 45b become conductive when a signal RESET_P as well as a signal IRE_BLD prepared for a certain constant current control are input to their gates, thereby causing a current Ibld to flow into the ground terminal and stabilizing a reset voltage Vreset to be output to the node DSA. As described above, the signal RESET_P is a signal that rises to "H" level when a reset operation is performed.

In this case, a current flowing through the NMOS transistor 44a when applying the reset voltage Vreset to the node DSA is equal to a current Ireset+Ifwd flowing into the bit line BL via the node DSA plus Ibld flowing into the ground terminal via the NMOS transistors 45a and 45b. The current mirror circuit including the PMOS transistors 44a and 44b mirrors the current in reset operation to the node CM1. That is, a current Ibld+(Ireset+Ifwd) that flows when the node DSA is set to the reset voltage Vreset flows into the node CM1 connected to the drain terminal of the PMOS transistor 44b.

(Configuration of Current Retaining Circuit IMEM)

The current retaining circuit IMEM is connected to the node CM1. The NMOS transistors 46a and 46b are connected in parallel to the node CM1, and the source of the transistor 46b is connected to the gate terminal GBK of the transistor 46a. In addition, the source of the transistor 46b is connected to the drain of a NMOS transistor 46c, the source of which in turn is connected to the ground. The gate of a NMOS transistor 46d that functions as a capacitor is connected to the gate terminal GBK, while the source and drain are both connected to the ground.

When the transistor 46c is set to off-state by the signal GRST, the transistor 46a provides a current path that causes a current flow from the node CM1 using the voltage transferred to the gate terminal GBK by the transistor 46b.

The transistor 46b has a gate to which a signal GTRN is input. If the signal GTRN has a voltage that is sufficiently higher than voltage VCM1 (a potential of the node CM1)+Vtn (a threshold voltage of the transistor 46b, taking into account the substrate bias effects of the voltage VCM1), the gate terminal GBK has the same potential as that of the node CM1. At this point, the transistor 46a becomes diode-connected state electrically. In addition, the transistor 46c is kept at off-state even after the potential of the node CM1 is transferred to the gate terminal GBK at a certain timing. This allows the current flowing from the node CM1 toward the ground terminal via the transistor 46a at that certain timing to continue to flow. That is, the transistors 46a to 46d are such circuits that temporarily memorize the current that flows through the node CM1 at a certain timing, and that allow continuous flow of the current thereafter. The current retaining circuit IMEM allows continuous flow of the current during subsequent reset operations that flows through the node CM1 before a reset voltage VRESET is applied to the selected memory cell MC.

(Configuration of Signal Output Circuit SOUT)

The signal output circuit SOUT is also connected to the node CM1. NMOS transistors 47a and 47b are such switches that are commonly controlled by a signal DET1. Furthermore, transistors 48a and 48b represents a current mirror circuit that mirrors a current flowing through the transistor 48a to the node CM2 connected to the transistor 47b.

The node CM2 is connected to another current mirror circuit including PMOS transistors 49a and 49b. In this case, the gate and drain of the transistor 49b are commonly diode-connected, and NMOS transistors 50a and 50b are connected in series to the drain of the transistor 49b. The transistor 50a is a switch that is controlled by a signal DET1, and the transistor 50b is a transistor that sets a reference current Irefrst for determining any change in the reset current Ireset flowing through a bit line BL. The transistor 50b becomes conductive based on a signal GIrefrst. The signal GIrefrst is at a certain voltage that allows the reference current Irefrst to flow through the transistor 50b having a certain transistor size.

When the transistors 47a, 47b, and 50a of the signal output circuit SOUT are set to on-state by a signal DET1, the current flowing through the node CM1 flows into the current path including the transistors 47a and 48a, and it is then mirrored to the node CM2. In addition, the reference current Irefrst flows into the transistor 50a and 50b. The node CM2 is a node for comparing this reference current Irefrst for reset operation determination with the current flowing through the node DSA. The current flowing through the node CM2 is determined at a NAND gate 51a, and a signal FLGRST is output from an inverter 51b.

A signal DET2 is input to the NAND gate 51a as an enable signal. The signal FLGRST indicates the completion of the reset operation when it is at "H" level. The signal FLGRST is input via the inverter 53a to the NAND gate 53b for controlling the voltage of the node DSA. In addition, a signal DCOUTn, a signal MATSEL, and a signal RESET_P are input to the NAND gate 53b. An output signal CTL_P2 of the NAND gate 53b sets a signal G_PCM2 to "L" level via the level shifter 54 when it is in "L" level, allowing a reset voltage to be applied to the node DSA. In contrast, when the signal CTL_P2 is in "H" level, the signal G_PCM2 is set to "H" level, the PMOS transistors 43a and 43b are cut off, and signal G_GND is set to "H" level via the NAND gate 31a and the inverter 31b, thereby discharging the node DSA by the transistor 36.

(Operation of Reset Pulse Control Circuit RSTCTL)

The reset pulse control circuit RSTCTL is a circuit that applies a reset voltage Vreset to a bit line in reset operation. It has a function for detecting the completion of the reset operation of a memory cell with change in the current flowing through the selected bit line BL to automatically stop application of reset voltage.

The memory cell MC is in such a state before reset operation where a current of not less than several μA flows therethrough. However, when the reset operation is completed and the memory cell MC is changed to a high resistance state, the resistance value of the variable resistance element VR is changed to on the order of 100 MΩ, with little current flowing through the memory cell. However, where little current will flow is only a selected memory cell MC, and hence a steady forward current Ifwd flows through the memory mat MAT when a voltage application scheme illustrated in FIG. 2A is employed such that the reverse leakage current Irev of the diode can be reduced. In addition, the reset pulse control circuit RSTCTL of this embodiment intentionally causes a current Ibld to flow from the node DSA to the ground terminal in order to stabilize a reset voltage Vreset. As such, the reset pulse control circuit RSTCTL according to this embodiment may detect any change in the current flowing through the selected memory cell, even if any background current other than the current flowing through the selected memory cell MC is involved in the selected bit line BL.

In reset operation of a memory cell MC based on the voltage application method illustrated in FIG. 2A, voltage Vreset-Vα is first applied to all of the word lines WL. Then, a reset voltage Vreset is applied to the selected bit line. During this state, a forward current Ifwd flows into memory cells in unselected state. In this case, the current path of the NMOS transistor 46a in the current retaining circuit IMEM allows continuous flow of the current provided before the current path of the transistor 47a is activated. While the forward current Ifwd flows through the memory cells in unselected state, the signal DET1 is set to "L" level whereby the signal output circuit SOUT is set to off-state. At this point, the forward current Ifwd flowing through unselected memory cells other than the selected memory cell MC via the bit lines BL, as well as the current Ibld leaking from the transistors 45a and 45b will flow into the current path of the NMOS transistor 46a. However, the voltage application method illustrated in FIG. 1B may be employed to prevent the forward current Ifwd.

Subsequently, the potential of the selected word line WL is reduced to 0V, and a reset operation is performed on the selected memory cell MC. In this case, the signal DET1 is set to "H" level, allowing the current flowing through the node CM1 to flow into the current path of the transistor 47a and 48a.

At this point, the signal GTRN is set to "L" level. In this case, it is desirable that the transistor 46a is sized to sufficiently suppress the effects of channel length modulation, as with the size of transistors commonly used for the current mirror circuits. That is, once the gate voltage is determined, the variations of the amount of currents flowing through the transistor 46a may be small over a broad range of drain voltage. Accordingly, if the signal GTRN is set to "L" level, the potential of the node GBK is still maintained by the transistor 46d as a capacitor, allowing the NMOS transistor 46a to continue to provide a current Ifwd+Ibld. Thus, the current path of the transistor 47a and 48a functions as a current path that causes a reset current Ireset to flow into the selected memory cell MC, among the current Ibld+(Ireset+Ifwd) flowing into the bit line BL via the node DSA in reset operation.

This means that a current when the selected memory cell MC does not flow a reset current is memorized in the current path of the transistor 46a in the current retaining circuit IMEM. Subsequently, the reset current Ireset starts to flow into the selected memory cell MC. In this way, only the reset current Ireset flowing through the selected memory cell MC may flow into the current path of the transistor 47a in the signal output circuit SOUT.

According to the reset pulse control circuit RSTCTL of this embodiment, only the reset current Ireset that is used for reset operation of the selected memory cell MC flows into the signal output circuit SOUT, among the current mirrored in reset operation from the reset voltage setting circuit VRSTC to the node CM1. Base on the reset current Ireset, the signal output circuit SOUT may detect the resistance state of the memory cell MC to control the operation of the reset pulse control circuit RSTCTL. That is, if the reset current Ireset flows, then the signals CTL_P2 and G_PCM2 are set to "L" level whereby the reset voltage Vreset is continuously applied to the selected memory cell MC. Alternatively, if the reset current Ireset no longer flows, then it is determined that the reset operation on the selected memory cell MC is completed, and the signals CTL_P2 and G_PCM2 are set to "H" level whereby application of the reset voltage Vreset terminates.

(Operations of Semiconductor Storage Device in First Embodiment)

Referring now to FIGS. 11A to 14B, the read, set, and reset operations of the resistive memory device according to this embodiment will be described below.

(Read Operation of Resistive Memory Device)

FIG. 11A is a timing chart in read operation of the resistive memory device; and Table 3 of FIG. 11B illustrates the states of several nodes at a particular timing in read operation. In read operation, as illustrated in Table 2 of FIG. 2B, a read voltage Vread is applied to the selected bit line BL. Then, depending upon the resistance states of the memory cell MC, cell currents Ion and Ioff will flow based on two operating points Pr0 and Pr1 illustrated in FIG. 5. Accordingly, the intermediate current is taken as a determination current Ith for reading, and then a sense operation is performed. In this embodiment, a read operation ends when the data read by the sense operation is retained in the latch circuit LT.

Firstly, prior to a read operation, the latch circuit LT is set to an initial state for read operation. That is, the signal SEL_ALL is set to "H" level and the node DC of the latch circuit LT is set to "L" level (see Table 3 of FIG. 11B). In addition, the signal RVFY_P indicative of execution of a read operation is set to "H" level to perform a read operation.

As illustrated in FIG. 11A, at time r0, a read voltage Vread is first applied to both the selected word line WL and the unselected word lines WL in the memory mat MAT including the selected memory cell MC.

Then, at time r1, the selected bit line BL is precharged to the read voltage Vread. As the selected bit line BL is precharged, the sense node NSEN connected to the selected bit line is also precharged at the same time. In this case, unselected memory cells MC will not be precharged because they are not connected to the selected bit line BL (see Table 3 of FIG. 11B). The voltage of the bit line BL connected to the node DSA illustrated in FIG. 9 is controlled by a clamp voltage BLCLAMP that is applied to the gate of the NMOS transistor 21. As such, at time r1, the signal RVFY_P is set to "H" level to make the transistor 36 non-conductive and the clamp voltage BLCLAMP is also set to Vread+Vtn. In this case, the voltage Vtn corresponds to a threshold voltage of the transistor 21, taking into account the substrate bias effects of the read voltage Vread.

Then, between time r1 and r2, the signal PRECHG is set to "H" level. This turns on the NMOS transistor 32b and increases the current provided for precharging the sense node NSEN via the clamp transistor 21, which may accelerate precharging of the selected bit line BL. At this point, a reference current IREF_R that is required for a read determination flows through the NMOS transistor 32a.

Then, at time r2, a precharge signal PRECHG is caused to fall and the selected word line WL is discharged to 0V. As a result, the state of the word lines WL and the bit lines BL is as illustrated in Table 2 of FIG. 2B. Then, a current flows from the selected bit line BL toward the selected word line WL depending upon the resistance states of the cell. In this case, if the selected memory cell MC is in a high resistance state (Roff), then the potential of the selected bit line BL is maintained at Vread. Alternatively, if the selected memory cell MC is in a low resistance state (Ron), then the cell current Icell flows into the selected memory cell MC and the potential of the selected bit line BL is slightly reduced.

The time from r2 to r3 represents a substantial data read time. The sense node NSEN is gradually discharged due to the difference between the reference current IREF_R and the cell current Icell flowing through the cell, and the potential of the sense node NSEN is correspondingly reduced. The data read is performed by determining whether the electric charges that are charged at time r2 in the capacitance of the sense node NSEN (the capacitor 35 and the parasitic capacitance) will be discharged to a certain potential (reference potential VREF_R) by time r3.

For example, a determination current Ith in a determination operation is defined as 0.4 µA, when the sense node NSEN has a parasitic capacitance of 100 fF, the reference current IREF_R is 0.2 µA, the time from r2 to r3 is 500 ns, the sense node NSEN has a precharge potential Vread of 2.5V, and the reference potential VREF_R is 1.5V.

As illustrated in FIG. 9, the potential of the sense node NSEN is amplified by the differential amplifier 22 and then input to the node GP of the PMOS transistor 24 via the data transfer circuit 23. In read operation, the data transfer circuit 23 activates inverters 23a and 23b to drive the node GP. Accordingly, for example, if the sense node NSEN has a potential higher than VREF_R, in other words, if the memory cell MC is in a high resistance state and the cell current Icell is less than 0.4 µA, then the node GP is in "L" level. Alternatively, if the sense node NSEN has a potential lower than VREF_R, in other words, if the memory cell MC is in a low resistance state and the cell current Icell is greater than 0.4 µA, then the node GP is in "H" level.

Then, at time r3, the signal STRBn is set to "L" level, the PMOS transistor 25 is turned on, and an output signal of the sense amplifier SA is captured by the latch circuit LT. The node of the latch circuit LT is set so that node DC="L" level by the initial data reset. Accordingly, if the node GP is at "H" level, then data of the latch circuit LT remains unchanged and the node DC is at "L" level; and if the node GP is at "L" level, then the node DC is changed to "H" level (see Table 3 of FIG. 12B). After a sufficient period of time has elapsed that is required for the node DC of the latch circuit LT to change its state, the signal STRBn is set to "H" level at time r4.

Then, at time r5, the signal PVFY_P is set to "L" level, and the selected bit line BL is discharged via the NMOS transistor 36. Subsequently, at time r6, the unselected word lines WL are discharged, after which the read operation for reading data from the memory cell MC to the latch circuit LT terminates.

If data is read to the outside of the chip, then the signal DTS is set to "H" level at a certain timing, and data input/output signal lines DQ and DQn are connected to the latch circuit LT. If the node DC is in-phase signal with an external output pin, then a low resistance state is output as data "0" level, a high resistance state being output as data "1" level.

(Set Operation of Resistive Memory Device)

Figure 12A:
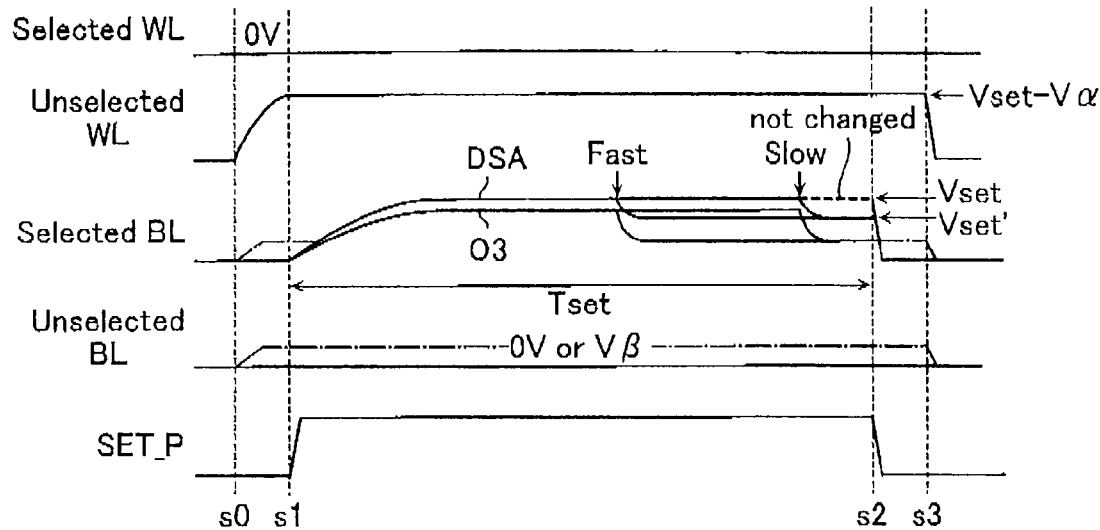
FIG. 12A is a timing chart illustrating a set operation of the resistive memory device of the first embodiment.
Figure 12B:
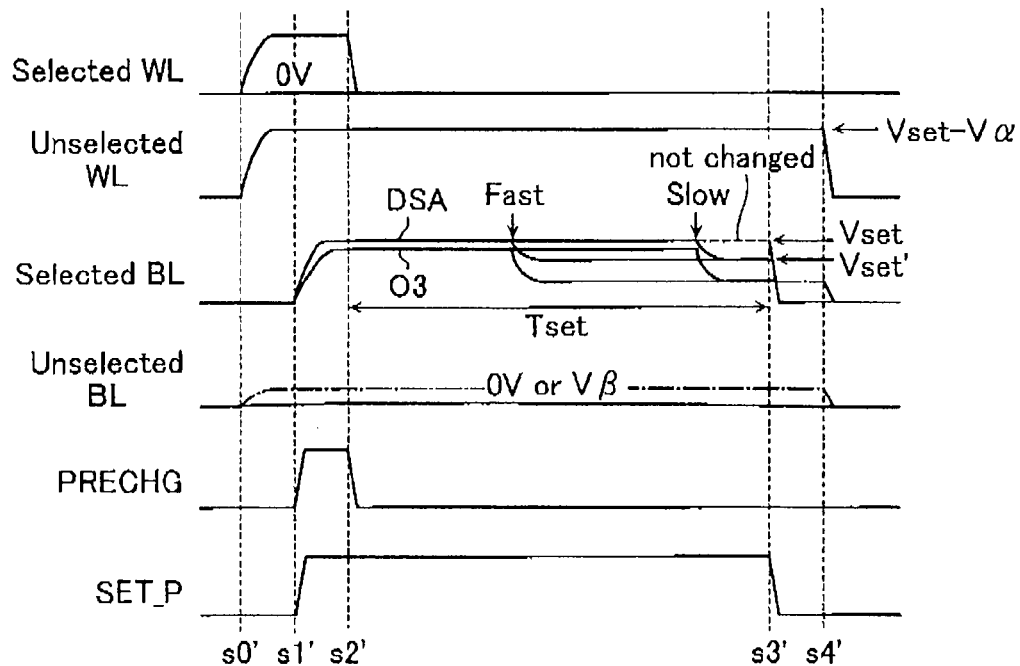
FIG. 12B is a timing chart illustrating a set operation of the resistive memory device of the first embodiment.

FIGS. 12A and 12B are timing charts in set operation of the resistive memory device; and Table 4 of FIG. 12C illustrates the states of several nodes at a particular timing in set operation.

Firstly, prior to a set operation, a signal RST_U is set to "H" level, and the nodes DC of all of the latch circuits LT are set to "H" level that are provided in the memory cell array for set operation. Then, at a certain timing, the signals DTS of the latch circuits LT are set to "H" level, and data is input to the latch circuits LT from the outside of the chip. "L" level of data is set at the node DC for data control circuits that apply a set pulse, and "H" level of data is set at the node DC for other data control circuits that do not apply a set pulse.

As illustrated in Table 4 of FIG. 12C, there are four different types of change in data due to the resistance states of the memory cell: "1"→"0", "0"→"0", "1"→"1", and "0"→"1". The node DC of the latch circuit LT to which "0" data is written is rewritten from "H" level to "L" level, while the node DC of the latch circuit LT to which "1" data is written remains at "H" level. In the following, a set operation will be described with reference to the timing chart illustrated in FIG. 12A.

Firstly, at time s0, a set-pulse application operation begins. An unselected word line voltage Vset-Vα is applied to an unselected word line WL.

Then, at time s1, the signal SET_P is set to "H" level and a set voltage Vset is applied to a selected bit line BL. In this case, the voltage of the selected bit line BL is allowed to rise at time s1 after time s0 so that a set voltage Vset will not be erroneously applied to the unselected memory cell MC. The timing chart of FIG. 12A illustrates both the voltage applied to the node DSA and the voltage applied to the node O3 of the selected bit line BL via the parasitic resistance R1 of FIG. 4, superposed one above the other. The same is true for the subsequent timing charts. In addition, voltage Vβ may also be applied to the selected bit line BL and the unselected bit line BL.

At time s1, the voltage Vset is supplied to the selected bit line via the PMOS transistors 34b, 33b, and the clamp transistor 21, as illustrated in FIG. 9. In this case, voltage Vset+Vtn is applied to the gate of the clamp transistor 21. Wherein, Vtn is a voltage that corresponds to a threshold voltage of NMOS transistor, taking into account the substrate bias effects of the voltage Vset. As a result, the voltage of the set pulse that is applied to the node DSA via the clamp transistor 21 becomes the voltage Vset.

In addition, in set operation, erroneous reset may occur after the completion of the set operation unless the current has been clamped, as described above. Thus, a pulse is applied with the current flowing through the PMOS transistor 34b being kept as low as the clamp current Iclamp, thereby preventing any erroneous reset in the memory cell MC. For this purpose, the NMOS transistor 32b is set to off-state, and the gate signal G_IREF_R of the NMOS transistor 32a is set to such voltage that allows a current Iclamp to flow. Since the PMOS transistors 34a and 34b are connected in the form of a current mirror circuit, the current flowing through the PMOS transistor 34b corresponds to the current Iclamp flowing through the PMOS transistor 34a. This current Iclamp flows into the node DSA via the clamp transistor 21. In this case, while the voltage application method as illustrated in FIG. 2B is effective since the set voltage Vset is the highest voltage in normal operation, the forward current Ifwd must be set sufficiently lower than the clamp current Iclamp for preventing incorrect reset.

In addition, the PMOS transistor 33b functions as a switch for determining whether to output a set pulse. The gate signal G_PCM1 applied to the transistor 33b is controlled by data of the latch circuit LT. As illustrated in Table 4 of FIG. 12C, if the written data is "0", then the node DC of the latch circuit LT is set to "L" level. In this case, the PMOS transistor 33b turns on when the signal G_PCM1="L" level, and the power supply voltage V_SEL that is applied to the source of the PMOS transistor 34b is applied to the sense node NSEN. Alternatively, if the written data is "1", then the node DC of the latch circuit LT is set to "H" level. In this case, when the signal G_PCM1 is set to "H" level, the PMOS transistors 33a and 33b turn off and the signal G_GND is set to "H" level, connecting the node DSA to the ground. This means that the data control circuit where the node DC="H" level will not apply set pulses to the bit lines BL.

A period from time s1 to s2 of FIG. 12A represents a set operation time Tset. When the memory cell MC changes from a high resistance state to a low resistance state within the set operation time Tset, the voltage of the selected bit line BL changes as indicated by "Fast" and "Slow". In this case, "Fast" indicates a memory cell that quickly transitions to a low resistance state, while "Slow" indicates a memory cell that slowly transitions to a low resistance state. That is, when the memory cell MC changes from a high resistance state to a low resistance state, current flows through the memory cell MC. At this point, since the clamp current Iclamp is fixed, the total voltage drop of the memory cell MC and the diode Di is reduced. Accordingly, upon completion of the resistance state change, the potential of the selected bit line changes from Vset to Vset' as illustrated in FIG. 12A. The potential of the bit line BL that is connected to a memory cell MC that does not transition to a low resistance state by time s2 is indicated by the broken line of FIG. 12A.

After the set operation time Tset has elapsed, the signal SET_P is set to "L" level at time s2, and the bit line BL is discharged via the NMOS transistor 37. Then, at time s3, the unselected word line WL is discharged, after which the set pulse application operation terminates.

During the set pulse application operation illustrated in FIG. 12A, the rise time will be significantly delayed because the selected bit line BL is charged while allowing the clamp current Iclamp to flow as illustrated in FIG. 12A.

As such, the timing chart of FIG. 12B illustrates a case where the selected bit line BL is first charged to the set voltage Vset during a period from time s1' to s2', and a period from time s2' when the selected word line WL is discharged to time s3' represents a set operation time Tset. In this case, since the set voltage Vset is not applied to the selected memory cell MC until time s2', the potential of the selected bit line BL may be caused to rise without clamping the current. This may be accomplished by setting the signal PRECHG to "H" level during time s1' to s2', and making the current provided by the PMOS transistor 34b greater than a current Iclamp for preventing erroneous reset.

(Reset Operation of Resistive Memory Device)

Figure 14A:
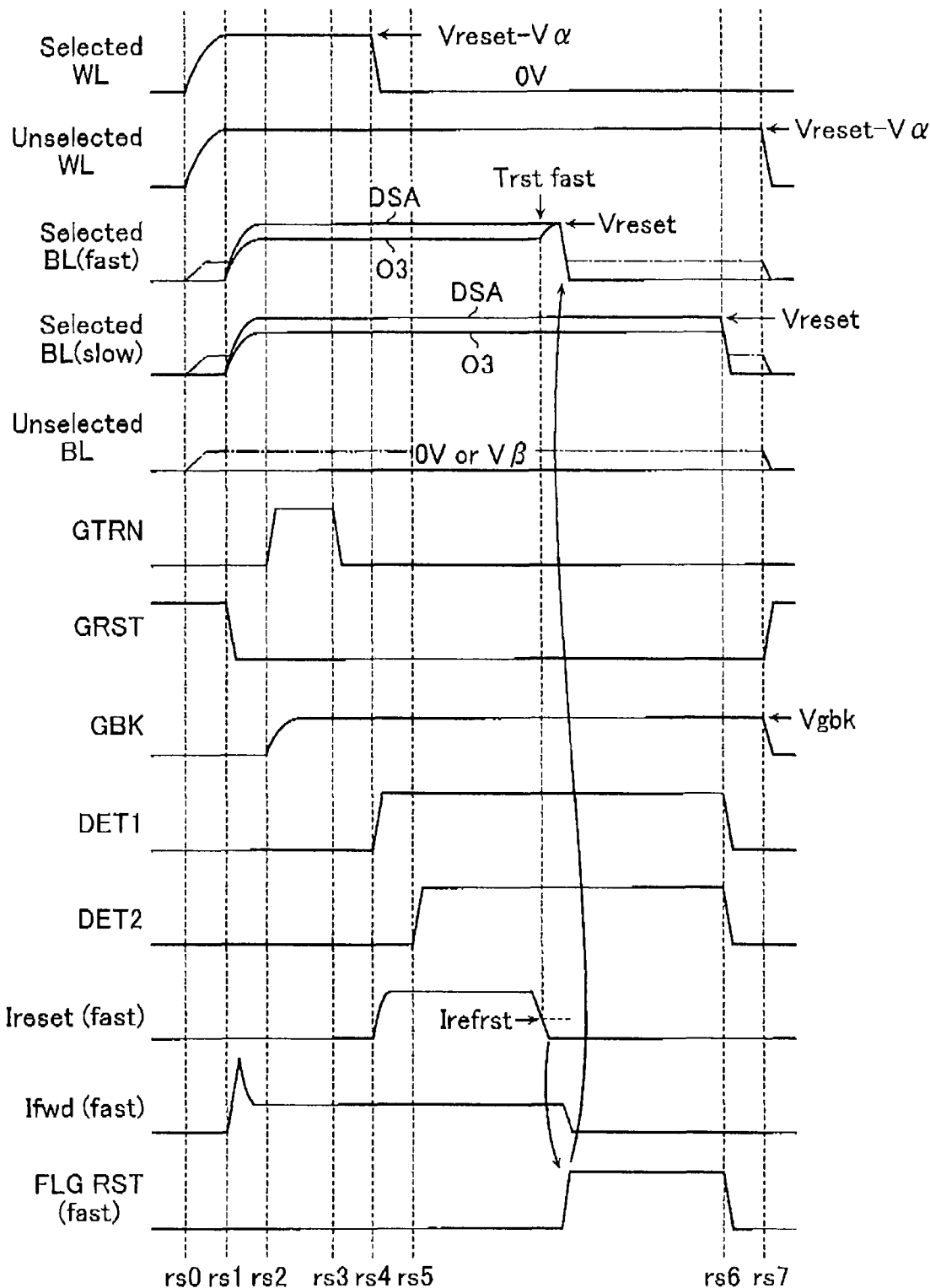
FIG. 14A is a timing chart illustrating a reset operation of the resistive memory device of the first embodiment.

FIGS. 13 and 14A are timing charts in reset operation of the resistive memory device; and Table 5 of FIG. 14B illustrates the states of several nodes at a particular timing in reset operation, Note that FIG. 13 is a timing chart of a reset pulse application operation according to a comparative example. Referring first to FIG. 13, the reset pulse application operation of the comparative example will be described below.

Firstly, at time rs0', voltage Vreset-Vα is applied to an unselected word line WL, and 0V or Vβ is applied to an unselected bit line BL at the same time.

Then, at time rs1', the signal RESET_P is set to "H" level and a reset voltage Vreset is applied to a selected bit line BL.

In this case, a period from time rs1' to rs2' of FIG. 13 represents a reset operation time Treset. When the memory cell MC changes from a low resistance state to a high resistance state within the reset operation time Treset, the voltage of the selected bit line BL changes as indicated by "Fast" and "Slow". In this case, "Fast" indicates a memory cell that quickly transitions to a high resistance state, while "Slow" indicates a memory cell that slowly transitions to a high resistance state. The potential of the bit line BL that is connected to a memory cell MC with no state transition by time rs2' is indicated by the broken line of FIG. 13. Once the memory cell MC changes from a low resistance state to a high resistance state, a larger voltage is provided to the memory cell MC as indicated by the operating point in reset operation in FIG. 7. Accordingly, upon completion of the resistance state change, the potential of the node O3 of the selected bit line BL will rise as illustrated in FIG. 13.

In reset operation, a voltage drop due to the parasitic resistance of the diode Di and the wirings is dominant when the memory cell MC is in a low resistance state, whereas voltage drop will mainly occurs in the memory cell MC when the memory cell MC enters a high resistance state. If the reset operation time Treset is fixed to a predetermined time, i.e., all the memory cell are provided with the same reset operation time Treset, a risk of erroneous setting may be increased. This is because a memory cell that changed its resistance state at an earlier point of time, as shown by the waveforms of FIG. 13, may be supplied with a voltage that rises after completion of the reset operation for a longer period of time.

FIG. 14A is a timing chart of a reset pulse application operation by the reset pulse control circuit RSTCTL according to this embodiment. In the following, the reset pulse application operation of this embodiment will be described with reference to FIG. 14A.

Firstly, prior to a reset operation, the signal RST_U is set to "H" level, and the nodes DC of all of the latch circuits LT provided on the memory mat MAT as a target of a reset operation are set to "H" level. Then, at a certain timing, the signals DTS of the latch circuits LT are set to "H" level, and data is input to the latch circuits LT from the outside of the chip. "L" level of data is set at the node DC of the data control circuits 20 that apply a reset pulse, and "H" level of data is set at the node DC of the other data control circuits 20 that do not apply a reset pulse.

As illustrated in Table 5 of FIG. 14B, there are four different types of change in data due to the resistance states of the memory cell MC: "1"→"0", "0"→"0", "1"→"1", and "0"→"1". In reset operation, the node DC of the latch circuit LT to which "1" data is written is rewritten from "H" level to "L" level, while the node DC of the latch circuit LT to which "0" data is written remains at "H" level (see Table 5 of FIG. 14B).

While a set pulse application operation begins at this state in the above-mentioned set operation, in this reset operation, a pre-read operation is performed prior to the reset pulse application operation.

Firstly, if the state change of the memory cell MC correspond to "1"→"0" and "0"→"0", then it is not necessary to apply a reset pulse to the memory cell MC. Thus, the sense node NSEN is not precharged in the pre-read operation. Since the node DC of the data control circuit has already been set to "H" level, data of the latch circuit LT will not change even if the signal STRBn is set to "L" level to capture the sensed data.

Then, if the state change of the memory cell MC corresponds to "1"→"1", then the sense node NSEN is precharged in read operation. The data transfer circuit 23 has the activated inverters 23a and 23b. In the memory cell MC that has already been set to a high resistance state, the sense node NSEN is first set to "H" level, the differential amplifier outputs "L" level, and hence the node GP is set to "L" level. When the signal STRBn is set to "L" level to capture the sensed data, the node DC is changed from "L" level to "H" level.

Then, if the state change of the memory cell MC corresponds to "0"→"1", the sense node NSEN is also precharged in read operation. In the memory cell MC in a low resistance state, the sense node NSEN is first set to "L" level, the differential amplifier outputs "H" level, and hence the node GP is set to "H" level. If the signal STRBn is set to "L" level to capture the sensed data, node DC still remains at "L" level. Thus, the node DC of the data control circuit that changes the state of the selected memory cell MC as "0"→"1" (i.e., changing the selected memory cell MC from a low resistance state to a high resistance state) is only set to "L" level. For this selected memory cell MC, the reset voltage Vreset is applied to the bit lines BL.

In the following, an operation for outputting the reset voltage Vreset will be described with reference to FIG. 14A.

Firstly, at time rs0, voltage Vreset-Vα is applied to the selected word line WL and the unselected word line WL. In addition, the signal GRST is set to "H" level and the gate terminal GBK is set to "L" level.

Then, at time rs1, the reset voltage Vreset starts to be applied to the selected bit line BL. The voltage Vreset is output from the reset pulse control circuit RSTCTL illustrated in FIG. 10. In addition, the signal GRST that is at "H" level before time rs1 is set to "L" level. As a result, the gate terminal GBK of the NMOS transistor 46a should no longer be in grounded state.

Then, at time rs2, a certain voltage at "H" level is applied to the gate terminal GTRN, and the potential of the node CM1 is transferred to the gate terminal GBK, thereby electrically providing a diode connection of the NMOS transistor 46a. In addition, charging of the selected bit line BL up to the reset voltage Vreset is completed by time rs2, and then a forward current Ifwd starts to flow through an unselected memory cell MC.

Since the signal DET1 is at "L" level during the period from time rs2 to rs3, the current that flows through the NMOS transistor 46a corresponds to the sum of a forward current Ifwd that is intentionally provided to the selected bit line BL and another current Ibld that is provided for stabilizing the voltage level of the reset pulse control circuit RSTCTL. As described above, the current retaining circuit IMEM allows the current Ifwd+Ibld to flow continuously as long as the signal GRST is at "L" level. However, if the voltage application method as illustrated in FIG. 1B is used to perform a reset operation, then no forward current Ifwd flows through the selected bit line BL.

Then, at time rs3, the signal GTRN is set to "L" level. As can be seen from above, for the transistor 46a, the potential Vgbk of the node GBK will still be retained by the transistor 46d as the capacitor if the signal GTRN is set to "L" level. Thus, the NMOS transistor 46a allows continuous flow of the current Ifwd+Ibld that flows during time rs2 to rs3.

Then, at time rs4, the selected word line WL is discharged to 0V, and a reset pulse starts to be applied to the selected memory cell MC. As such, in addition to the above-mentioned current Ifwd+Ibld, a reset current Ireset starts to flow through the selected bit line BL. In addition, at time rs4, the signal DET1 is set to "H" level, and a current comparison is started at the node CM2. Then, at time rs5, the signal DET2 is set to "H" level to ensure that an output signal FLGRST corresponding to the determination of the node CM2 is output from the signal output circuit SOUT.

In FIG. 14A, (fast) is appended to the voltage waveforms of the selected bit line of the memory cell MC where the resistance state transition of the memory cell MC is completed at an earlier timing, i.e., within time rs4 to rs6 during which a reset current is allowed to flow, whereas (slow) is appended to the voltage waveforms of the selected bit line of the memory cell. MC where the transition is not completed within time rs4 to rs6. For the waveform of the reset current flowing through the selected memory cell MC, such a memory cell MC is only indicated by Ireset (fast) where the resistance state changes earlier. In addition, for the forward current waveform, such a forward current is only indicated by Ifwd (fast) that flows through the bit line BL connected to the cell where the resistance state changes earlier.

As illustrated in FIG. 10, the reset current Ireset flowing through the selected memory cell MC is mirrored to the node CM2, which current in turn is compared against the reference current Irefrst at the node CM2. At a timing Trstfast of FIG. 14A, due to the state change of the selected memory cell MC, Ireset (fast) gradually decreases to be smaller than the reference current Irefrst in due course. Then, when the operating point of the node CM2 changes, the signal FLGRST is set to "H" level. When the signal FLGRST is set to "H" level, the signal CTL_P2 is set to "H" level and the signal G_PCM2 is also set to "H" level resulting from level shifting, after which the PMOS transistors 43a and 43b of the reset voltage setting circuit VRSTC are set to off-state. Since the signal G_GND is also set to "H" level, the NMOS transistor 36 turns on and the node DSA and the selected bit line BL are connected to the ground, after which the reset pulse application operation terminates.

Furthermore, if the memory cell MC does not complete its transition to a reset state, the signal RESET_P is set to "L" level at a certain time rs6, and then the bit line BL is discharged via the NMOS transistor 37, after which the reset pulse application operation terminates.

Finally, at time rs7, the unselected word line WL and the unselected bit line BL are discharged and the signal GRST is further set to "H" level to discharge the gate terminal GBK, with the reset operation ending thereafter.

(Advantages of Semiconductor Storage Device in First Embodiment)

According to the reset pulse control circuit RSTCTL of this embodiment, after the selected memory cell MC changes its resistance state, application of reset voltage may be automatically stopped in reset operation. This stoppage of reset voltage application may be controlled for each hit line BL.

When the reset operation is performed on a plurality of memory cells MC at the same time, the respective resistance states may change at different points of time if any variations exist in performance of the memory cells MC. Given that reset pulses are applied to the plurality of memory cells MC for the same period of time, a set operation may be erroneously performed on those memory cells MC for which the reset operation has been completed at earlier points in time. Since the reset pulse control circuit RSTCTL of this embodiment automatically stops application of reset voltage for each bit line BL, the likelihood of erroneous setting is reduced.

In addition, according to the voltage application method for the memory mat MAT as illustrated in FIG. 2A, there is provided a current retaining circuit IMEM that memorizes any currents other than the reset current Ireset (e.g., a forward current Ifwd) flowing through the bit lines BL. Thus, precise control of reset pulses can be achieved by detecting, in reset operation, only such current Ireset being used for the reset operation of the selected memory cell MC, among those flowing through the bit lines BL. The resistive memory device of this embodiment may effectively suppress the occurrence of erroneous setting after the reset operation of the memory cells MC.

In the resistive memory device of this embodiment, a current memorized in the current retaining circuit IMEM is equal to a forward current Ifwd plus a current Ibld flowing through the reset voltage setting circuit VRSTC. However, the current retaining circuit IMEM may only retain the forward current Ifwd if no current Ibld flows through the reset voltage setting circuit VRSTC. In addition, according to the voltage application method illustrated in FIG. 1B, the current retaining circuit IMEM may only retain the current Ibld flowing through the reset voltage setting circuit VRSTC if no forward current Ifwd flows.

Second Embodiment (Configuration of Semiconductor Storage Device in Second Embodiment)

Figure 15:
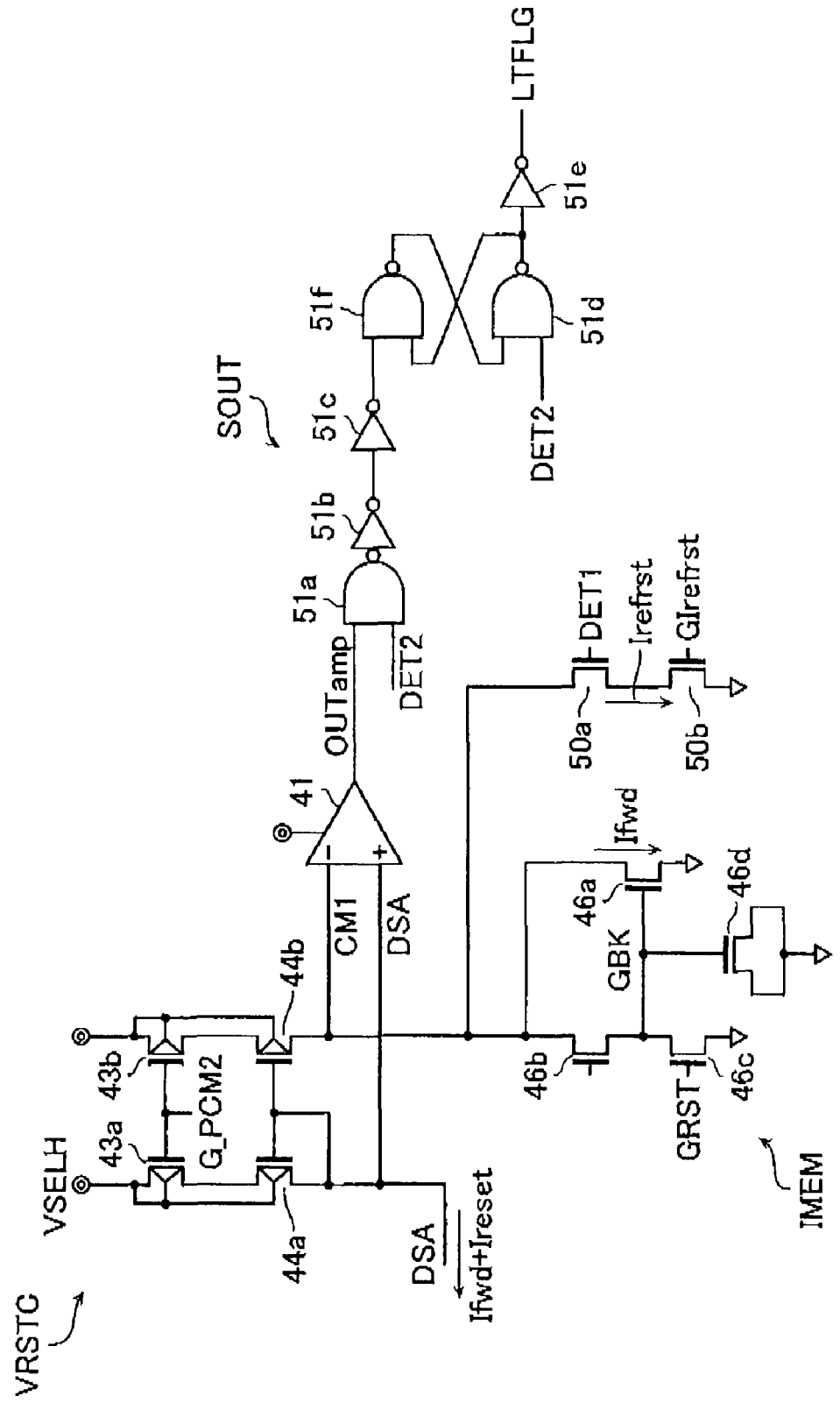
FIG. 15 is a circuit diagram illustrating details of a data control circuit 20 according to a second embodiment.

A second embodiment of the present invention will now be described below. The resistive memory device of this embodiment comprises the memory mats MAT, the data control circuits 20, etc., that are configured in the same way as those in the resistive memory device of the first embodiment described above. The resistive memory device of this embodiment is different from the resistive memory device of the first embodiment in the configuration of the reset pulse control circuit RSTCTL. In the following, a reset pulse control circuit RSTCTL of a data control circuit 20 according to the second embodiment will be described with reference to FIG. 15.

The reset pulse control circuit RSTCTL includes a reset voltage setting circuit VRSTC, a current retaining circuit IMEM, and a signal output circuit SOUT.

(Configuration of Reset Voltage Setting Circuit VRSTC)

The reset voltage setting circuit VRSTC of this embodiment is a circuit that sets the voltage of the bit line BL connected to the node IDSA to a reset voltage Vreset'. The reset voltage setting circuit VRSTC includes PMOS transistors 44a and 44b that are connected in the form of a current mirror circuit, and PMOS transistors 43a and 43b representing the output switches of the current mirror circuit. The switching operation of the transistors 43a and 43b is the same as described in the first embodiment.

The reset voltage setting circuit VRSTC of this embodiment is different from the first embodiment in that a reset voltage Vreset' to be output to the node DSA is equal to a power supply voltage VSELH applied to the PMOS transistor 43a minus a threshold voltage (Vtp) of the transistor 44a.

According to this embodiment, a current flowing through the PMOS transistor 43a of the current mirror circuit when applying the reset voltage Vreset' is equal to a reset current Ireset causing a reset operation of the selected memory cell MC plus a forward current Ifwd flowing through an unselected memory cell MC. The current mirror circuit including the PMOS transistors 44a and 44b mirrors the current when the reset voltage Vreset' is applied to the bit lines BL, to the node CM1. That is, a current Ireset+Ifwd that flows when the node DSA is set to the reset voltage Vreset' flows into the node CM1 connected to the drain terminal of the PMOS transistor 44b.

(Configuration of Current Retaining Circuit IMEM)

The current retaining circuit IMEM is connected to the node CM1. The configuration of the NMOS transistors 46a to 46d included in the current retaining circuit IMEM and the function of the current retaining circuit IMEM are the same as described in the first embodiment. That is, the transistors 46a to 46d are such circuits that temporarily memorize the current that flows through the node CM1 at a certain timing, and that allow continuous flow of the current thereafter. The current retaining circuit IMEM allows continuous flow of the current during subsequent reset operations that flows through the node CM1 before a reset voltage VRESET is applied to the selected memory cell MC. In this case, only the current Ifwd flows through the current path of the transistor 46a because of the absence of the current Ibid described in the first embodiment.

(Configuration of Signal Output Circuit SOUT)

The signal output circuit SOUT comprises a differential amplifier 41 that has a non-inverting input terminal to which the node DSA is connected and an inverting input terminal to which the node CM1 is connected. In this case, NMOS transistors 50a and 50b are connected in series to the node CM1. As in the first embodiment, the transistor 50b is a transistor that sets a reference current Irefrst for determining any change in the reset current Ireset.

The differential amplifier 41 compares the current Ireset+Ifwd flowing through the selected bit line BL with the sum of the forward current Ifwd flowing through the bit line BL and the reference current Irefrst. The output node OUTamp of the differential amplifier 41 is connected to a NAND gate 51a. The output terminal of the NAND gate 51a is connected to an SR flip-flop circuit including NAND gates 51f and 51d via inverters 51b and 51c. Signals DET2 are input to the NAND gate 51a and the SR flip-flop circuit as enable signals. The SR flip-flop circuit outputs a signal LTFLG via an inverter 51e.

When the transistor 50a is set to on-state by a signal DET1, a reference current Irefrst flows into the transistor 50a and 50b. As described above, the differential amplifier 41 compares the current Ireset+Ifwd flowing through the selected bit line BL with the sum of the forward current Ifwd flowing through the bit line BL and the reference current Irefrst. The result is output via the NAND gate 51a and the SR flip-flop circuit.

Upon completion of the reset operation, the current Ireset flowing through the selected memory cell MC decreases, and the output signal LTFLG is set to "H" level accordingly. The signal LTFLG is input via the inverter 53a to the NAND gate 53b for controlling the voltage of the node DSA, instead of the signal FLGRST. An output signal CTL_P2 of the NAND gate 53b sets a signal G_PCM2 to "L" level via the level shifter 54 when it is in "L" level, allowing a reset voltage to be applied to the node DSA. In contrast, when the signal CTL_P2 is in "H" level, the signal G_PCM2 is set to "H" level, the PMOS transistors 43a and 43b are cut off, and the signal G_GND is set to "H" level via the NAND gate 31a and the inverter 31b, thereby discharging the node DSA by the transistor 36. In this case, since the output signal of the current comparison results is output by the SR flip-flop circuit, the signal LTFLG should not be inverted again even if the bit line BL is abruptly discharged by the NMOS transistor 36.

(Operation of Reset Pulse Control Circuit RSTCTL)

The reset pulse control circuit RSTCTL of this embodiment also has a function for detecting the completion of the reset operation of a memory cell MC with change in the current flowing through the selected bit line BL to automatically stop application of reset voltage.

In reset operation of the memory cell MC, voltage Vreset-Vα is first applied to all of the word lines WL. Thereafter, reset voltage Vreset is applied to the selected bit line BL. During this state, a forward current Ifwd flows into memory cells MC in unselected state.

In this case, the current path of the NMOS transistor 46a of the current retaining circuit IMEM allows continuous flow of the current provided before a reset operation is performed on the selected memory cell. While the forward current Ifwd flows through the memory cells MC in unselected state, the signals DET1 and DET2 are set to "L" level, whereby the signal output circuit SOUT is set to off-state. At this point, the forward current Ifwd flowing through memory cells other than the selected memory cell MC will flow into the current path of the NMOS transistor 46a via the bit line BL. Subsequently, the potential of the selected word line WL is reduced to 0V, and a reset operation is performed on the selected memory cell MC.

According to the reset pulse control circuit RSTCTL of this embodiment, in reset operation, the current Ireset+Ifwd that has been mirrored to the node CM1 by the reset voltage setting circuit VRSTC is compared with the sum of the forward current Ifwd and the reference current Irefrst. Based on the comparison result, the signal output circuit SOUT may detect the resistance state of the memory cell MC to control the operation of the reset pulse control circuit RSTCTL. That is, if the reset current Ireset flows, then the signals CTL_P2 and G_PCM2 are set to "L" level whereby the reset voltage Vreset is continuously applied to the selected memory cell MC. Alternatively, if the reset current Ireset no longer flows, then it is determined that the reset operation on the selected memory cell MC is completed, and the signals CTL_P2 and G_PCM2 are set to "H" level whereby application of the reset voltage Vreset terminates.

(Reset Operation of Semiconductor Storage Device in Second Embodiment)

Figure 16:
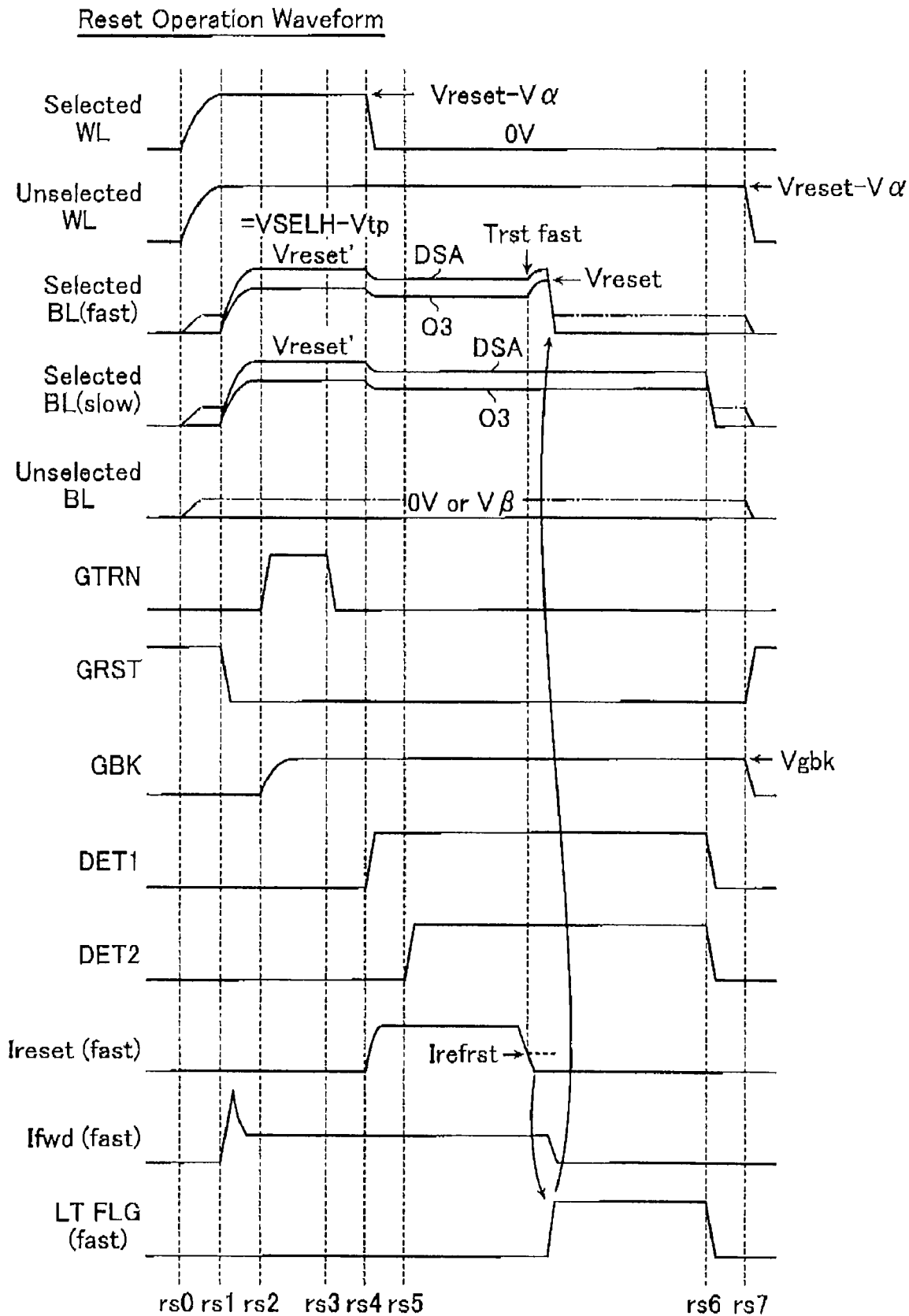
FIG. 16 is a timing chart illustrating a reset operation of the resistive memory device of the second embodiment.

Referring now to FIG. 16, a reset operation of the resistive memory device of this embodiment will be described below.

FIG. 16 is a timing chart illustrating a reset pulse application operation of the reset pulse control circuit RSTCTL of this embodiment. The operation of inputting data to the latch circuit LT prior to a reset pulse application operation and the pre-read operation are the same as the first embodiment.

The second embodiment is different from the first embodiment as illustrated in FIG. 14A in the value of voltage Vreset' which is provided to the selected bit line BL after time rs1. The reset voltage Vreset' is equal to a power supply voltage VSELH applied to the MOS transistor 43a minus a threshold voltage (Vtp) of the transistor 44a. In addition, the value of voltage Vreset' varies with the current flowing through the bit line BL. Thus, when the selected word line WL is discharged at time rs4 and a current starts to flow into the selected memory cell MC, the value of voltage to be applied to the bit line BL via the node DSA will decrease. This is also different from the first embodiment.

In the timing chart of FIG. 16, except the above-mentioned change in voltage of the selected bit line BL, the timing when to apply voltage to the bit lines BL and the word lines WL, the timing when to apply signals, and the current waveforms are the same as the first embodiment.

(Advantages of Semiconductor Storage Device in Second Embodiment)

According to the reset pulse control circuit RSTCTL of this embodiment, after the selected memory cell MC changes its resistance state, application of reset voltage may be automatically stopped in reset operation. This stoppage of reset voltage application may be controlled for each bit line BL, reducing the likelihood of erroneous setting.

In addition, there is provided a current retaining circuit IMEM that memorizes any currents other than the reset current Ireset (e.g., a forward current Ifwd) flowing through the bit lines BL according to the state of voltage being applied to the memory cell array. Thus, reset pulses can be controlled by detecting, in reset operation, only such current Ireset being used for the reset operation of the selected memory cell MC, among those flowing through the bit lines BL, and by precisely comparing the current Ireset against the reference current Irefrst. In addition, the reset pulse control circuit RSTCTL of this embodiment consumes less current than the reset pulse control circuit RSTCTL of the first embodiment. The resistive memory device of this embodiment may effectively suppress the occurrence of erroneous setting after the reset operation of the memory cells MC.

According to this embodiment, the voltage to be output to the bit lines BL is affected by the threshold voltage of the PMOS transistor 44a. If this effect needs to be compensated, such power supply voltage VSELH may be used that takes into account the variations of the threshold voltage Vtp. In addition, the variations of the threshold voltage Vtp of the transistor 44a due to the manufacturing process may be optimized by trimming.

Third Embodiment (Configuration of Semiconductor Storage Device in Third Embodiment)

A third embodiment of the present invention will now be described below. The resistive memory device of this embodiment comprises the memory mats MAT, the data control circuits 20, etc., that are configured in the same way as those in the semiconductor storage device of the first embodiment described above. In this embodiment, an auto-set operation and an auto-reset operation on a plurality of memory cells MC are described.

(Configuration of Latch Data Check Circuit)

Figure 17:
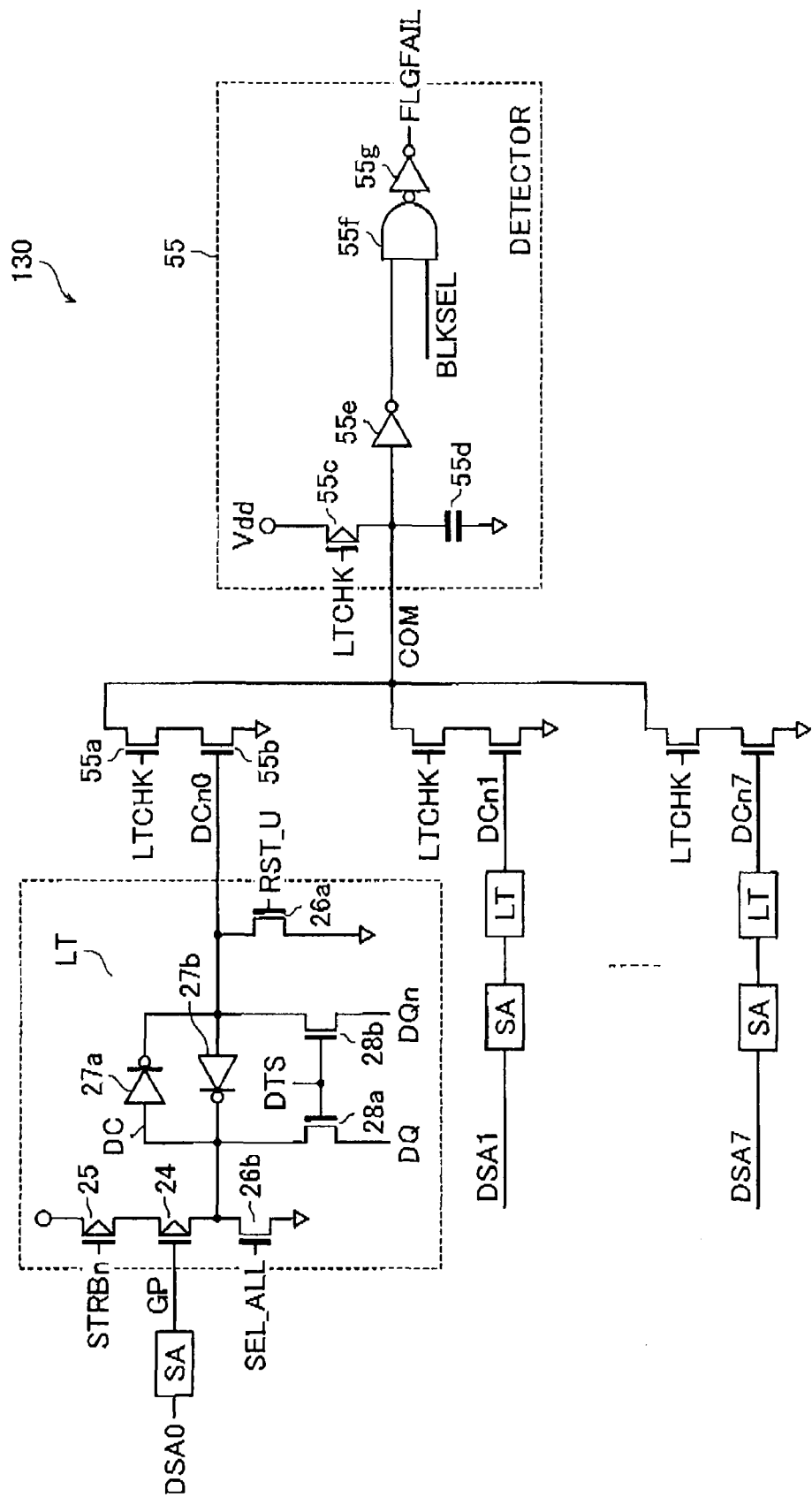
FIG. 17 is a circuit diagram illustrating details of a latch data check circuit according to a third embodiment.

FIG. 17 illustrates a latch data check circuit 130 of the resistive memory device according to this embodiment. In this case, the node DSA, the sense amplifiers SA, and the latch circuits LT of FIG. 17 are configured in the same way as the corresponding parts of the data control circuit 20 illustrated in FIG. 9.

The latch data check circuit 130 has discharge circuits, each of which includes a NMOS transistor 55b having its gate connected to the node DC of a latch circuit LTn, and a NMOS transistor 55a connected between the drain of the transistor 55b and a node COM. The source terminal of the transistor 55b is connected to the ground, and the discharge circuit connects the node COM to the ground according to the state of the node DCn and the signal LTCHK.

The operation of this embodiment is performed on a plurality of memory cells MC at the same time. The bit lines BL that apply voltage to a plurality of memory cells MC on the memory mat MAT are connected to the sense amplifiers SA and the latch circuits LT of each data control circuit 20 via respective nodes DSA. A state of the selected memory cell MC connected to a plurality of bit lines BL may be obtained by determining the states of the plurality of latch circuits LT.

The discharge circuit including transistors 55a and 55b is provided for each of the plurality of latch circuits LT that collectively determine the states. The node COM is commonly connected to the drains of the transistors 55a in the discharge circuits. In FIG. 17, the node COM is connected to the respective discharge circuits associated with the latch circuits LT connected to the nodes DSA0 to DSA7.

In addition, the latch data check circuit 130 has a detection circuit 55 that is connected to the node COM and that determines the potential of the node COM. The detection circuit 55 includes: a PMOS transistor 55c that precharges the node COM based on a signal LTCHK; a capacitor 55d that supports retainment of the potential of the node COM; and logic gates 55e, 55f and 55g that determine the potential of the node COM. A signal BLKSEL is input to the NAND gate 55f as an enable signal, and the detection circuit 55 outputs a signal FLGFAIL based on the potential of the node COM.

(Operation of Latch Data Check Circuit)

The operation of the latch data check circuit 130 of this embodiment will now be described below.

Firstly, the signal LTCHK is set to "L" level and the PMOS transistor 55c turns on. As a result, the node COM is precharged to the power supply voltage Vdd. Then, when the signal LTCHK is set to "H" level, the PMOS transistor 55c turns off, precharging of the node COM is stopped, and the NMOS transistor 55a of each discharge circuit turns on. The node COM is discharged if any of the latch circuits LT should have the node DCn at "H" level that are connected to the discharge circuits commonly connected to the node COM. When the signal BLKSEL is set to "H" level during this state, the signal FLGFAIL is set to "H" level.

Alternatively, if all of the nodes DCn are set to "L" level, then the node COM will retain the precharged potential without discharging. In this case, when the signal BLKSEL is set to "H" level, the signal FLGFAIL is set to "L" level.

Accordingly, the detection circuit 55 may collectively detect whether the data retained in all of the latch circuits LT for detection is the data represented by the nodes DCn that are set to "L" level.

(Operation of Semiconductor Storage Device in Third Embodiment)

Figure 18:
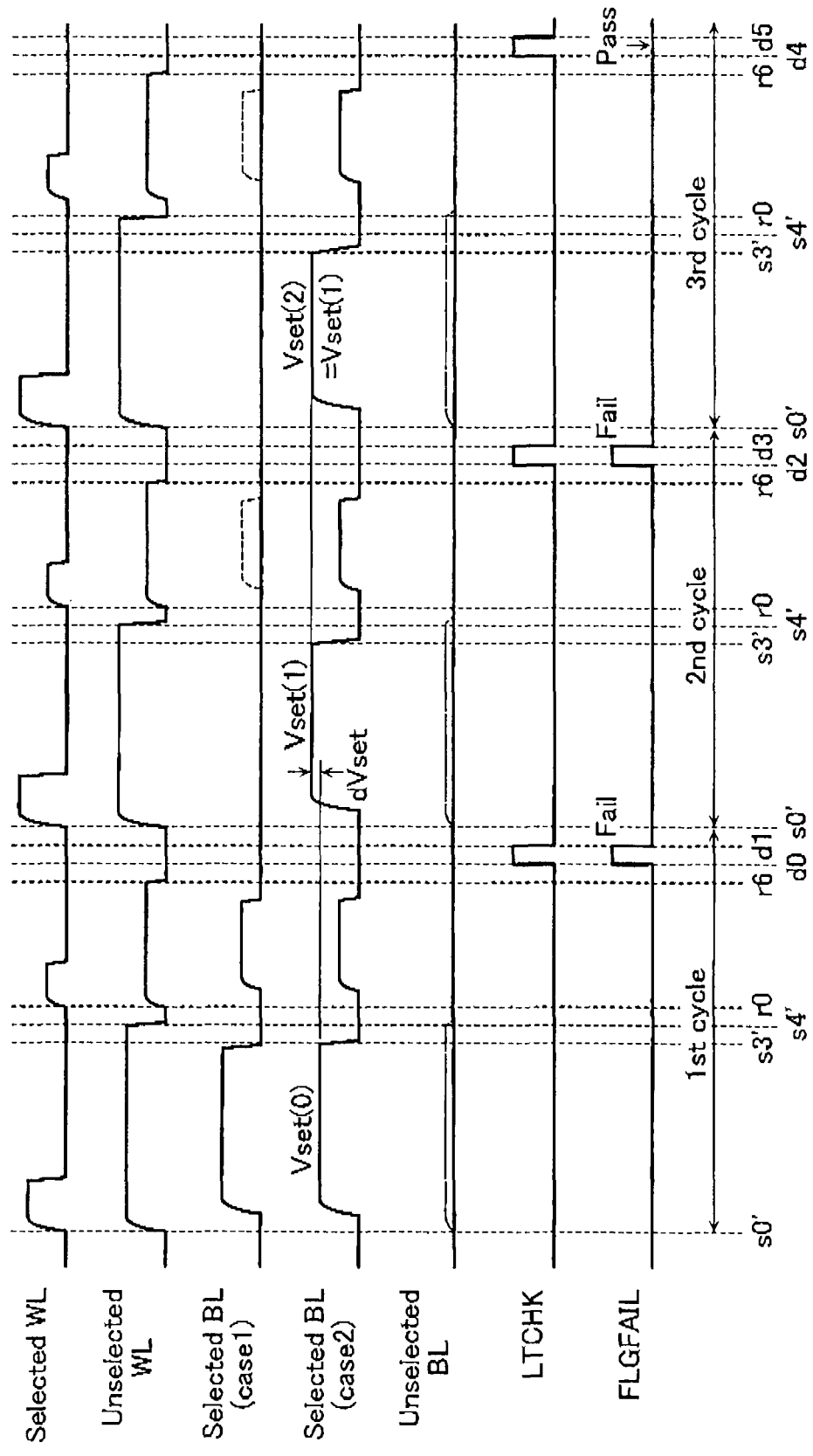
FIG. 18 is a timing chart illustrating an auto-set operation of a resistive memory device of the third embodiment.
Figure 19:
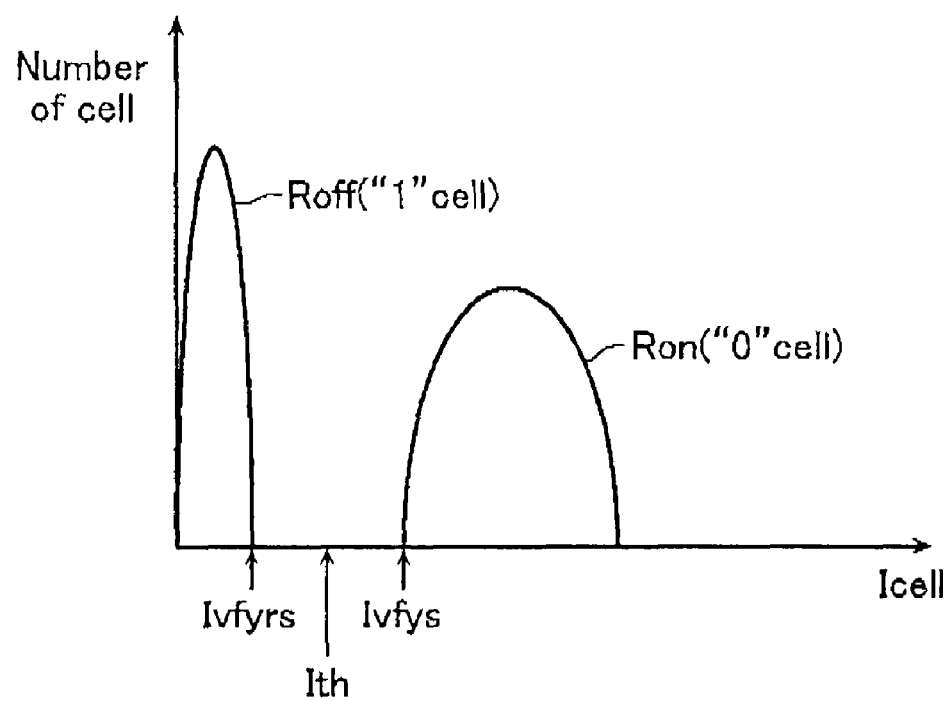
FIG. 19 illustrates verify currents in the resistive memory device of the third embodiment.

Referring now to FIGS. 18 to 20, an auto-set operation and an auto-reset operation of the resistive memory device of this embodiment will be described below. As used herein, the auto-set operation and the auto-reset operation refer to such operations where set (reset) pulse application operations and set (reset) verify operations are automatically repeated until set (reset) operations of a plurality of memory cells MC to be collectively processed are completed. It is also assumed that the set and reset operations on individual memory cells MC involves the same voltage application operation as the first embodiment.

(Auto-Set Operation of Resistive Memory Device)

FIG. 18 is a timing chart in auto-set operation of the resistive memory device. In FIG. 18, (Case 1) is appended to one selected bit line BL that is connected to a memory cell MC which finishes the transition to set state at an earlier time, whereas (Case 2) is appended to another selected bit line BL that is connected to another memory cell MC which finishes the transition to set state at a later time. FIG. 18 illustrates the auto-set operation waveforms in the case of performing the auto-set operation at the same time on a plurality of memory cells MC that transition to set state at different times, and requiring three cycles of set pulse application operation before the set operation of a memory cell MC of 2-bit can be completed. In addition, for one cycle of pulse application operation, a period from time s0' to s4' represents a substantial time for applying a set pulse and a period from time r0 to r6 represents a set verify operation time. Furthermore, a period from time d0 to d1 represents a latch data check time. In auto-set operation, after a set pulse is applied, set verify/latch data check operations are performed to detect the states of a plurality of memory cells MC. The resistive memory device continues the auto-set operation as long as the resistance state of any of the memory cells MC is not changed to set state.

Firstly, an auto-set operation begins at time s0'. The set operation waveforms during the time from s0' to s4' for applying pulses are similar to those previously described in the first embodiment, and time s0' to time s4' correspond to time s0' to time s4' illustrated in FIG. 12B. It is assumed herein that the memory cell MC connected to the selected bit line BL (Case 1) transitions from a high resistance state to a low resistance state through the first cycle of set pulse application operation. On the other hand, it is also assumed that there is no transition of the resistance state of the memory cell MC connected to the selected bit line BL (Case 2) through the first cycle of set pulse application operation.

A set verify operation begins at time r0. The set verify operation is accomplished in a similar manner to the read operation of the first embodiment as mentioned above.

The set operation waveforms during the time from r0 to r6 for the set verify operation are similar to the read operation waveforms described in the first embodiment, and time r0 to time r6 correspond to time r0 to time r6 illustrated in FIG. 11A. At time r6, data that is read from the memory cell MC is retained in the latch circuit LT. According to the set verify operation of this embodiment, there is provided a set verify current (Ivfys) that is greater than a determination current (Ith) in normal read operation by a certain value (see FIG. 19), in order to check whether the memory cell MC has sufficiently changed to a low resistance state. That is, a sense operation is performed with the set verify current Ivfys taken as the determination current, after which data is captured by the latch circuit LT.

The selected memory cell MC connected to the selected bit line BL (Case 1) changes to a low resistance state Ron after the first cycle of set pulse application operation. Thus, the cell current Icell becomes larger than the set verify current Ivfys, and hence the differential amplifier 22 that sensed the sense node NSEN outputs "H" level. Since the inverter 23c of the data transfer circuit 23 of FIG. 9 is activated in set verify operation, the node GP is set to "L" level. Thereafter, when the signal STRBn becomes "L" level, the state of the node DC of the latch circuit LT is inverted from "L" level to "H" level. For the latch circuit LT connected to the selected bit line BL (Case 1), the node DC is set to "H" level and the node DCn is set to "L" level after the first cycle of set verify operation. In this case, the data control circuit will no longer output a set pulse after the next cycle.

On the other hand, the selected memory cell MC connected to the selected bit line BL (Case 2) still remains in the same resistance state after the first cycle of set pulse application operation. In this case, the data of the latch circuit LT cannot be inverted because the cell current Icell is smaller than the set verify current Ivfys and thus the node GP is at "H" level. For the latch circuit connected to the selected bit line BL (Case 2), the node DC retains "L" level and the node DCn retains "H" level. Meanwhile, the respective states of the nodes in set verify operation are illustrated in Table 4 of FIG. 12C.

Then, at time d0, the signal LTCHK of the latch data check circuit 130 is set to "H" level, after which data checking is initiated by the latch data check circuit 130. As described above, the states of the nodes DCn of the latch circuits LT that are connected to the plurality of memory cells MC are collectively detected by the latch data check circuit 130.

For the latch circuit LT connected to the selected bit line BL (Case 1), the node DC is set to "H" level and the node DCn is set to "L" level. On the other hand, for the latch circuit connected to the selected bit line BL (Case 2), the node DC retains "L" level and the node DCn retains "H" level. Since the latch data check circuit outputs signal FLGFAIL="H" level if any of the nodes DCn is at "H" level, the output signal FLGFAIL of the latch data check circuit 130 becomes "H" level at time d1.

Thereafter, the auto-set operation cycles are repeated until the output signal FLGFAIL of the latch data check circuit becomes "L" level. It is assumed that the memory cell MC connected to the selected bit line BL (Case 2) transitions from a high resistance state to a low resistance state through the third cycle of set pulse application operation.

In this case, the output signal FLGFAIL of the latch data check circuit 130 becomes "L" level at the time of data checking during time d4 to d5 in the third cycle, and then an output is provided to the circuits external to the chip indicating that the set operation has been completed for all memory cells MC. As a result, the auto-set operation terminates.

In this case, the set voltage Vset for respective cycles of auto-set operation may be increased each time the auto-set operation is repeated. As illustrated in FIG. 18, for example, it may be increased by a certain amount dVset after each cycle, as with the set voltage Vset (1) in the second cycle being increased relative to the set voltage Vset (0) in the first cycle.

In addition, the process for increasing the set voltage may be stopped after repeating multiple cycles of auto-set operation. As illustrated in FIG. 18, for example, the set voltage in the third cycle is set as Vset (2)=Vset (1), and the process for increasing Vset may be stopped when a certain number of cycles is reached. When this set voltage application method is employed, the distribution of the states of the memory cell MC that are set by the set operation may be precisely controlled by beginning with a set voltage Vset of as low a value as possible and suppressing an increase in voltage of dVset. In addition, the step-up of set voltage Vset is stopped at a certain number of cycles mainly for the reason of restricting the voltage applied to the transistors within a range of breakdown voltage compensation.

Furthermore, the number of cycles in which the auto-set operation is repeated needs to be restricted to the specified times. If there are any memory cells MC for which the set operation is not completed when a maximum number of cycles is reached, then the status circuit 180 of FIG. 8 may inform the outside of the chip that the set operation ends up in "Fail" according to the signal FLGFAIL of the latch data check circuit 130.

(Auto-Reset Operation of Resistive Memory Device)

FIG. 20 is a timing chart in auto-reset operation of the resistive memory device. In FIG. 20, (Case 1) is appended to one selected bit line BL that is connected to a memory cell MC which finishes the transition to reset state at an earlier time, whereas (Case 2) is appended to another selected bit line DL that is connected to another memory cell MC which finishes the transition to reset state at a later time. FIG. 20 illustrates the auto-reset operation waveforms in the case of performing the auto-reset operation at the same time on a plurality of memory cells MC that transition to reset state at different times, and requiring three cycles of reset pulse application operation before the reset operation of a memory cell MC of 2-bit can be completed. In addition, for one cycle of pulse application operation, a period from time rs0 to rs7 represents a substantial time for applying a reset pulse and a period from time r0 to r6 represents a reset verify operation time. Furthermore, a period from time d0 to d1 represents a latch data check time. In auto-reset operation, after a reset pulse is applied, reset verify/latch data check operations are performed to detect the states of a plurality of memory cells MC. The resistive memory device continues the auto-reset operation as long as the resistance state of any of the memory cells MC is not changed to reset state.

In auto-reset operation, unlike the above-mentioned auto-set operation, a pre-read operation similar to the above-mentioned reset operation is performed during a period preread before performing the first cycle of auto-reset operation. Based on the results of the pre-read operation, the reset pulse application operation is only performed on those memory cells MC in low resistance states.

Firstly, an auto-reset operation begins at time rs0. The reset operation waveforms during the time from rs0 to rs7 for applying pulses are similar to those previously described in the first embodiment, and time rs0 to time rs7 correspond to time rs0 to time rs7 illustrated in FIG. 14A. It is assumed herein that the memory cell MC connected to the selected bit line BL (Case 1) transitions from a low resistance state to a high resistance state through the first cycle of reset pulse application operation. On the other hand, it is also assumed that there is no transition of the resistance state of the memory cell MC connected to the selected bit line BL (Case 2) through the first cycle of set pulse application operation.

A reset verify operation begins at time r0. The reset verify operation is accomplished in a similar manner to the read operation of the first embodiment as mentioned above.

The waveforms during the time from r0 to r6 for the reset verify operation are similar to the read operation waveforms described in the first embodiment, and time r0 to time r6 correspond to time r0 to time r6 illustrated in FIG. 11A. At time r6, data that is read from the memory cell MC is retained in the latch circuit LT. According to the reset verify operation of this embodiment, there is provided a reset verify current (Ivfyrs) that is smaller than a determination current (Ith) in normal read operation by a certain value (see FIG. 19), in order to check whether the memory cell MC has sufficiently changed to a high resistance state. That is, a sense operation is performed with the reset verify current Ivfyrs taken as the determination current, after which data is captured by the latch circuit LT.

The selected memory cell MC connected to the selected bit line BL (Case 1) changes to a high resistance state Roff after the first cycle of reset pulse application operation. Thus, the cell current Icell becomes smaller than the reset verify current Ivfyrs, and hence the differential amplifier 22 that sensed the sense node NSEN outputs "L" level. Since the inverters 23a and 23b of the data transfer circuit 23 of FIG. 9 are activated in reset verify operation, the node GP is set to "L" level. Thereafter, when the signal STRBn becomes "L" level, the state of the node DC of the latch circuit LT is inverted from "L" level to "H" level. For the latch circuit LT connected to the selected bit line BL (Case 1), the node DC is set to "H" level and the node DCn is set to "L" level after the first cycle of reset verify operation. In this case, the data control circuit will no longer output a reset pulse after the next cycle.

On the other hand, the selected memory cell MC connected to the selected bit line BL (Case 2) still remains in the same resistance state after the first cycle of reset pulse application operation. In this case, the data of the latch circuit LT cannot be inverted because the cell current Icell is larger than the reset verify current Ivfyrs and thus the node GP is at "H" level. For the latch circuit connected to the selected bit line BL (Case 2), the node DC retains "L" level and the node DCn retains "H" level. Meanwhile, the respective states of the nodes in reset verify operation are illustrated in Table 5 of FIG. 14B.

Then, at time d2, the signal LTCHK of the latch data check circuit 130 is set to "H" level, after which data checking is initiated by the latch data check circuit 130. As described above, the states of the nodes DCn of the latch circuits LT that are connected to the plurality of memory cells MC are collectively detected by the latch data check circuit 130.

For the latch circuit LT connected to the selected bit line BL (Case 1), the node DC is set to "H" level and the node DCn is set to "L" level. On the other hand, for the latch circuit connected to the selected bit line BL (Case 2), the node DC retains "L" level and the node DCn retains "H" level. Since the latch data check circuit outputs signal FLGFAIL="H" level if any of the nodes DCn is at "H" level, the output signal FLGFAIL of the latch data check circuit 130 becomes "H" level at time d1.

Thereafter, the auto-reset operation cycles are repeated until the output signal FLGFAIL of the latch data check circuit becomes "L" level. It is assumed that the memory cell MC connected to the selected bit line BL (Case 2) transitions from a low resistance state to a high resistance state through the third cycle of reset pulse application operation.

In this case, the output signal FLGFAIL of the latch data check circuit 130 becomes "L" level at the time of data checking during time d6 to d7 in the third cycle, and then an output is provided to the circuits external to the chip indicating that the reset operation has been completed for all memory cells MC. As a result, the auto-reset operation terminates.

It should be appreciated that the reset pulse control circuit RSTCTL of this embodiment may also automatically stop application of reset voltage in reset operation after the Selected memory cell MC changes its resistance state, as in the first and second embodiments. This stoppage of reset voltage application may be controlled for each bit line BL. Thus, the reset pulse application operation on the selected bit line BL (Case 1) ends at timing Tsrt1 within the time for applying a reset pulse in the first cycle. Similarly, the reset pulse application operation on the selected bit line BL (Case 2) ends at timing Tsrt2 within the time for applying a reset pulse in the third cycle.

In addition, the auto-reset operation involves similar processes to the auto-set operation, such as step-up of the reset voltage Vreset, setting of the upper bound of the reset voltage Vreset, limitation of the number of cycles, status process of the entire auto-reset operation, and so on.

(Advantages of Semiconductor Storage Device in Third Embodiment)

According to the reset pulse control circuit RSTCTL of this embodiment, after the selected memory cell MC changes its resistance state, application of reset voltage may be automatically stopped in reset operation. This stoppage of reset voltage application may be controlled for each bit line BL.

When the reset operation is performed on a plurality of memory cells MC at the same time, the respective resistance states may change at different times if any variations exist in performance of the memory cells MC. Given that reset pulses are applied to the plurality of memory cells MC only for a certain and fixed period of time, a set operation may be erroneously performed on those memory cells MC for which the reset operation is completed at earlier points in time. Since the reset pulse control circuit RSTCTL of this embodiment automatically stops application of reset voltage for each bit line BL, the likelihood of erroneous setting may be reduced.

In addition, since the stoppage of reset voltage application may be controlled for each bit line BL, a reset pulse will not be applied to those memory cells MC again for which the reset operation has been completed and that has changed its resistance state. Thus, the risk of erroneous setting may be avoided if the reset pulse application operation is repeated. The resistive memory device according to this embodiment may effectively suppress the occurrence of erroneous setting after the reset operation of the memory cells MC.

While embodiments of the present invention have been described, the present invention is not intended to be limited to the disclosed embodiments, and various other changes, additions or the like may be made thereto without departing from the spirit of the invention.

What is claimed is:

1. A semiconductor storage device comprising:
   a memory cell array having memory cells positioned at intersections between a plurality of first wirings and a plurality of second wirings, each of the memory cells including a rectifier element and a variable resistance element connected in series; and
   a control circuit configured to apply a first voltage to a selected one of the first wirings as well as a second voltage to a selected one of the second wirings, so that a first potential difference is applied to a selected memory cell positioned at an intersection between the selected one of the first wirings and the selected one of the second wirings,
   the control circuit comprising:
      a signal output circuit configured to output a first signal based on a first current flowing through the selected memory cell via the selected one of the first wirings and the selected one of the second wirings and a reference current; and
      a current retaining circuit configured to retain a second current flowing through the first wirings or a wiring electrically connected to the first wirings during a certain period of time,
   the signal output circuit being configured to determine the first current based on the second current retained by the current retaining circuit; and
   the control circuit being configured to stop application of the first voltage to the first wirings based on the first signal.

2. The semiconductor storage device according to claim 1, wherein
   the signal output circuit is configured to determine the first current by deducting the second current from a current flowing through the first wirings and a wiring electrically connected to the first wirings; and
   the signal output circuit is configured to output the first signal by comparing the first current against the reference current.

3. The semiconductor storage device according to claim 1, wherein
   the signal output circuit is configured to output the first signal by comparing a current flowing through the first wirings with a current resulting from addition of the reference current to the second current.

4. The semiconductor storage device according to claim 1, wherein
   prior to starting application of the first voltage and the second voltage to the selected one of the first wirings and the selected one of the second wirings, the control circuit reads a state of the selected memory cell and controls application of the first voltage and the second voltage to the first wirings and the second wirings based on the read state of the selected memory cell.

5. The semiconductor storage device according to claim 1, wherein
the variable resistance element changes from a low resistance state to a high resistance state due to the first potential difference.

6. The semiconductor storage device according to claim 1, wherein
the current retaining circuit comprises:
a first transistor configured to provide a current path along which the second current is caused to flow when a certain voltage is applied to its gate terminal during the certain period of time; and
a voltage retaining element configured to be connected to a gate terminal of the first transistor and retain voltage of the gate terminal while the second current flows through the first transistor.

7. The semiconductor storage device according to claim 1, wherein
the control circuit is configured to apply a bias voltage greater than the second voltage and smaller than the first voltage to an unselected one of the first wirings, so that a reverse-bias with a second potential difference smaller than the first potential difference is applied to an unselected memory cell positioned at an intersection between the unselected one of the first wirings and an unselected one of the second wirings.

8. The semiconductor storage device according to claim 1, wherein
the control circuit is configured to apply a bias voltage greater than the second voltage and smaller than the first voltage to an unselected one of the second wirings, so that a reverse-bias with a second potential difference smaller than the first potential difference is applied to an unselected memory cell positioned at an intersection between an unselected one of the first wirings and the unselected one of the second wirings.

9. The semiconductor storage device according to claim 1, wherein
the control circuit is configured to apply a bias voltage greater than the second voltage and smaller than the first voltage to an unselected one of the first wirings, as well as a third voltage smaller than the first voltage and greater than the bias voltage to an unselected one of the second wirings, so that a reverse-bias with a second potential difference smaller than the first potential difference is applied to an unselected memory cell positioned at an intersection between the unselected one of the first wirings and the unselected one of the second wirings.

10. The semiconductor storage device according to claim 9, wherein
the second current is a forward leakage current that is caused to flow through the unselected memory cell by the bias voltage and the third voltage.

11. The semiconductor storage device according to claim 1, wherein
the wiring electrically connected to the first wirings causes a constant current of a certain current value to flow into a ground terminal when the first current is caused to flow through the first wirings; and
the second current is a constant current that flows through the wirings.

12. A semiconductor storage device comprising:
a memory cell array having memory cells positioned at intersections between a plurality of first wirings and a plurality of second wirings, each of the memory cells including a rectifier element and a variable resistance element connected in series; and
a control circuit configured to apply a first voltage to a plurality of first wirings selected from the first wirings as well as a second voltage to a selected one of the second wirings, so that a first potential difference is applied to a plurality of selected memory cells positioned at intersections between the plurality of first wirings selected from the first wirings and the selected one of the second wirings,
the control circuit comprising:
a signal output circuit configured to output a first signal based on a first current flowing through the selected memory cells via a selected one of the first wirings and a selected one of the second wirings and a reference current; and
a current retaining circuit configured to retain a second current flowing through the first wirings or a wiring electrically connected to the first wirings during a certain period of time,
the signal output circuit being configured to determine the first current based on the second current retained by the current retaining circuit; and
the control circuit being configured to stop application of voltage to one selected memory cell based on the first signal, while continuing application of voltage to the other selected memory cell based on the first signal.

13. The semiconductor storage device according to claim 12, wherein
prior to starting application of the first voltage and the second voltage to a plurality of first wirings selected from the first wirings and a selected one of the second wirings, the control circuit reads respective states of the plurality of selected memory cells and controls application of the first voltage and the second voltage to the first wirings and the second wirings based on the read states of the selected memory cells.

14. The semiconductor storage device according to claim 12, wherein
the control circuit is configured to make a potential difference larger than the first potential difference that is to be applied to a selected memory cell to which memory cell voltage continues to be applied.

15. The semiconductor storage device according to claim 12, wherein
the variable resistance element changes from a low resistance state to a high resistance state due to the first potential difference.

16. The semiconductor storage device according to claim 12, wherein
the control circuit is configured to apply a bias voltage greater than the second voltage and smaller than the first voltage to an unselected one of the first wirings, so that a reverse-bias with a second potential difference smaller than the first potential difference is applied to an unselected memory cell positioned at an intersection between the unselected one of the first wirings and an unselected one of the second wirings.

17. The semiconductor storage device according to claim 12, wherein
the control circuit is configured to apply a bias voltage greater than the second voltage and smaller than the first voltage to an unselected one of the second wirings, so that a reverse-bias with a second potential difference smaller than the first potential difference is applied to an unselected memory cell positioned at an intersection between an unselected one of the first wirings and the unselected one of the second wirings.

18. The semiconductor storage device according to claim 12, wherein the control circuit is configured to apply a bias voltage greater than the second voltage and smaller than the first voltage to an unselected one of the first wirings, as well as a third voltage smaller than the first voltage and greater than the bias voltage to an unselected one of the second wirings, so that a reverse-bias with a second potential difference smaller than the first potential difference is applied to an unselected memory cell positioned at an intersection between the unselected one of the first wirings and the unselected one of the second wirings.

19. A semiconductor storage device comprising:

a memory cell array having memory cells positioned at intersections between a plurality of first wirings and a plurality of second wirings, each of the memory cells including a rectifier element and a variable resistance element connected in series; and a control circuit configured to apply a first voltage to a plurality of first wirings selected from the first wirings, as well as a second voltage to a selected one of the second wirings, so that a first potential difference is applied to a plurality of selected memory cells arranged at intersections between the plurality of first wirings selected from the first wirings and the selected one of the second wirings, the control circuit comprising:

a signal output circuit configured to output a first signal based on a first current flowing through the selected memory cells via a selected one of the first wirings and a selected one of the second wirings and a reference current;

a current retaining circuit configured to retain a second current flowing through the first wirings or a wiring electrically connected to the first wirings during a certain period of time; and a detection circuit configured to read respective states of the plurality of selected memory cells after the first voltage and the second voltage are applied to a plurality of first wirings selected from the first wirings and a selected one of the second wirings, and detect whether the read resistance states of the selected memory cells have changed or not, the signal output circuit being configured to determine the first current based on the second current retained by the current retaining circuit; and the control circuit being configured to stop application of voltage to one selected memory cell based on the first signal, while continuing application of voltage to the other selected memory cell based on the first signal, and the control circuit being configured to repeat application of the first voltage and the second voltage to the first wirings and the second wirings until the detection circuit detects that resistance states of all of the selected memory cells have changed.

20. The semiconductor storage device according to claim 19, wherein prior to starting application of the first voltage and the second voltage to a plurality of first wirings selected from the first wirings and a selected one of the second wirings, the control circuit reads states of the plurality of selected memory cells and controls application of the first voltage and the second voltage to the first wirings and the second wirings based on the read states of the selected memory cells.

* * * * *